United States Patent
Myung et al.

(10) Patent No.: US 8,707,128 B2
(45) Date of Patent: Apr. 22, 2014

(54) METHOD AND APPARATUS FOR CHANNEL ENCODING AND DECODING IN A BROADCASTING/COMMUNICATION SYSTEM USING LOW DENSITY PARITY-CHECK CODES

(75) Inventors: Se-Ho Myung, Gyeonggi-do (KR); Hong-Sil Jeong, Seoul (KR)

(73) Assignee: Samsung Electronics Co., Ltd (KR)

( * ) Notice: Subject to any disclaimer, the term of this patent is extended or adjusted under 35 U.S.C. 154(b) by 205 days.

(21) Appl. No.: 13/345,264

(22) Filed: Jan. 6, 2012

(65) Prior Publication Data
US 2012/0179948 A1    Jul. 12, 2012

(30) Foreign Application Priority Data
Jan. 6, 2011    (KR) .................. 10-2011-0001269

(51) Int. Cl.
*H03M 13/00*    (2006.01)

(52) U.S. Cl.
USPC ............ 714/758; 714/752; 714/755; 714/777

(58) Field of Classification Search
USPC .................................. 714/752, 755, 758, 777
See application file for complete search history.

(56) References Cited

U.S. PATENT DOCUMENTS

| | | | |
|---|---|---|---|
| 7,313,752 B2 | 12/2007 | Kyung et al. | |
| 7,856,592 B2 | 12/2010 | Hong et al. | |
| 2006/0026488 A1 | 2/2006 | Kim et al. | |
| 2009/0249157 A1 | 10/2009 | Lee et al. | |
| 2009/0259915 A1* | 10/2009 | Livshitz et al. | 714/758 |
| 2010/0153823 A1* | 6/2010 | Noda | 714/777 |

* cited by examiner

*Primary Examiner* — Sam Rizk
(74) *Attorney, Agent, or Firm* — The Farrell Law Firm, P.C.

(57) ABSTRACT

An apparatus and a method are provided for encoding and decoding in a broadcasting/communication system using a Low Density Parity Check (LDPC) code. A weight-1 position sequence conversion procedure is performed on an initial parity check matrix. Shortening is applied on an information word. A codeword is generated by LDPC encoding the information word using a parity check matrix generated by performing the weight-1 position sequence conversion procedure. Puncturing is then applied to the codeword.

20 Claims, 14 Drawing Sheets

FIG.2

METHOD AND APPARATUS FOR CHANNEL ENCODING AND DECODING IN A BROADCASTING/COMMUNICATION SYSTEM USING LOW DENSITY PARITY-CHECK CODES

PRIORITY

This application claims priority under 35 U.S.C. §119(a) to Korean Patent Application Serial No. 10-2011-0001269, which was filed in the Korean Intellectual Property Office on Jan. 6, 2011, the entire content of which is hereby incorporated by reference.

BACKGROUND OF THE INVENTION

1. Field of the Invention

The present invention relates to a broadcasting/communication system that uses a linear code based on a parity check matrix.

2. Description of the Related Art

Shortening or puncturing may be applied to a parity check code in a broadcasting/communication system in order to obtain various code lengths or performance improvements.

When a transmission terminal shortens a portion of an information word, a limitation of a value '0' is set to a predetermined position. Because a receiver knows this already, the transmission terminal does not transmit values limited to '0'.

Shortening may be performed by limiting a value of a portion of an information word bit to '0', and may be performed by not using a column corresponding to an information word bit whose values are limited to '0' in a given parity check matrix.

When applying puncturing to a given parity check code, a receiver regards punctured bits as erasures to perform decoding using a parity check matrix of the parity check code. However, this decoding method becomes more inefficient as the number of punctured bits increases.

More specifically, when a broadcasting/communication system that uses a Low Density Parity Check (LDPC) code applies iterative decoding, a slow decoding convergence characteristic is represented, thereby limiting performance improvement within a limited decoding complexity.

SUMMARY OF THE INVENTION

The present invention is designed to address at least the above-described problems and/or disadvantages and to provide at least the advantages described below.

Accordingly, an aspect of the present invention is to provide a method and an apparatus for encoding and decoding a channel in a broadcasting/communication system using an LDPC code.

Another aspect of the present invention is to provide a method and an apparatus for increasing channel encoding and decoding efficiency when applying puncturing or shortening to a parity check code or an LDPC code in a broadcasting/communication system.

Another aspect of the present invention is to provide a method and an apparatus for transforming a parity check matrix of an LDPC code in order to reduce decoding complexity and improve performance when applying puncturing in a broadcasting/communication system using an LDPC code.

Another aspect of the present invention is to provide a method and an apparatus for performing encoding and decoding from a transformed parity check matrix.

In accordance with an aspect of the present invention, an encoding method of a transmission terminal in a broadcasting/communication system using an LDPC code is provided. The method includes performing a weight-1 position sequence conversion procedure on an initial parity check matrix; shortening an information word; generating a codeword by LDPC encoding the shortened information word using a parity check matrix generated by performing the weight-1 position sequence conversion procedure; and puncturing the codeword.

In accordance with another aspect of the present invention, a decoding method of a reception terminal in a broadcasting/communication system using an LDPC code is provided. The method includes determining or estimating a puncturing and shortening pattern from a received signal, when puncturing or shortening has been applied; performing a weight-1 position sequence conversion procedure on an initial parity check matrix based on the determined or estimated puncturing or shortening pattern; and performing an LDPC decoding on the received signal using information regarding the converted parity check matrix.

In accordance with another aspect of the present invention, an apparatus of a transmission terminal is provided for performing encoding using an LDPC code. The apparatus includes a parity check matrix extractor for performing a weight-1 position sequence conversion procedure on an initial parity check matrix; a shortening unit for shortening an information word; a parity check matrix conversion unit for generating a parity check matrix by performing the weight-1 position sequence conversion procedure; an LDPC encoder for generating a codeword by LDPC encoding the information word using the parity check matrix; and a puncturing unit for puncturing the codeword.

In accordance with another aspect of the present invention, an apparatus of a reception terminal is provided, for performing decoding using an LDPC code. The apparatus includes a shortening, puncturing pattern determining or estimating unit for determining or estimating a puncturing and shortening pattern from a received signal, when puncturing or shortening has been applied; a parity check matrix extractor for performing a weight-1 position sequence conversion procedure on an initial parity check matrix based on the determined or estimated puncturing and shortening pattern; and an LDPC decoder for LDPC decoding the received signal using information regarding the converted parity check matrix.

BRIEF DESCRIPTION OF THE DRAWINGS

The above and other aspects, features, and advantages of certain embodiments of the present invention will be more apparent from the following description taken in conjunction with the accompanying drawings, in which:

FIG. 2 illustrates an LDPC code parity check matrix according to an embodiment of the present invention;

Throughout the drawings, like reference numerals will be understood to refer to like parts, components, and structures.

DETAILED DESCRIPTION OF EMBODIMENTS OF THE INVENTION

Figure 1:
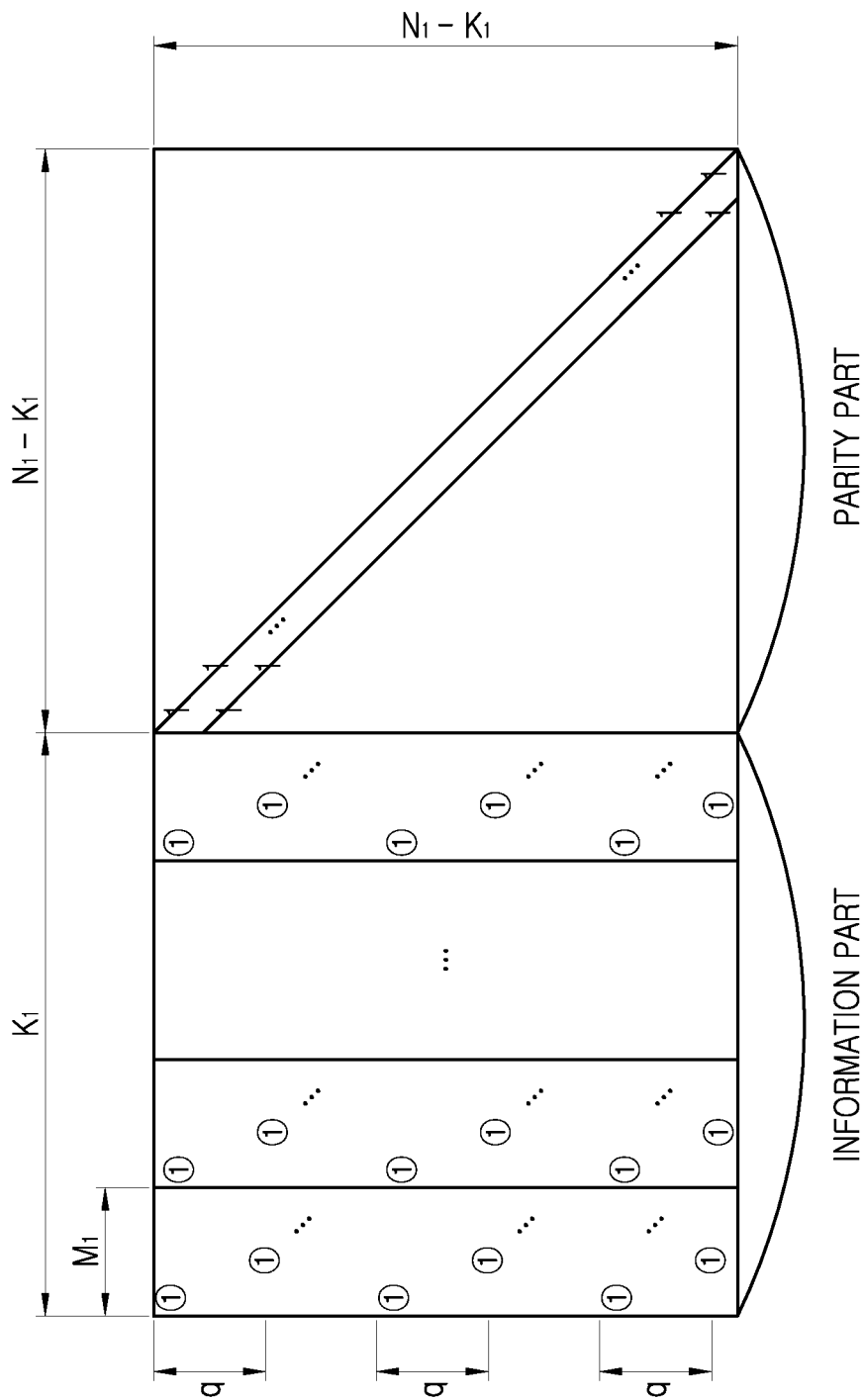
FIG. 1 illustrates a parity check matrix according to an embodiment of the present invention.

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

A parity-check code, which is a linear code based on a parity check matrix, may be defined using a parity check matrix or a generated matrix. Further, a parity check code may be defined in a wide variety of forms depending on requirements of a communication and broadcasting system.

Generally, when a parity check matrix H of a parity check code or a generated matrix G is given, assuming that an information word formed of K information bits and having a length of K is $\underline{m}=(m_0, m_1, \ldots, m_{K-1})$, a relation of $\underline{m} \cdot G = \underline{c}$, $H \cdot \underline{c}^T = 0$ is satisfied.

Here, $\underline{c}$ denotes a codeword obtained from a message $\underline{m}$. In addition, when a codeword of a given linear code is systematic code, the codeword $\underline{c}$ is expressed by $\underline{c}=(\underline{m}, \underline{p})$, where $\underline{p}$ denotes a parity.

Generally, when a message length (a length of an information word) is K, a length of a codeword is N, the length of a parity becomes (N−K), and the size of a parity check matrix becomes (N−K)×N, when the matrix has a full rank.

A parity check matrix H expressed by Equation (1) is an example of a specific systematic code.

$$H = \begin{bmatrix} 1 & 0 & 0 & 0 & 1 & 0 & 0 & 1 & 0 \\ 0 & 1 & 1 & 0 & 0 & 0 & 0 & 1 & 0 \\ 0 & 1 & 0 & 0 & 0 & 1 & 0 & 0 & 1 \\ 1 & 0 & 0 & 1 & 0 & 0 & 0 & 0 & 1 \\ 1 & 0 & 1 & 1 & 0 & 0 & 1 & 0 & 0 \end{bmatrix} \quad (1)$$

Here, a codeword c corresponding to the parity check matrix is configured as $\underline{c}=(\underline{m}, \underline{p})$ from an information word $\underline{m}=(m_0, m_1, m_2, m_3)$ formed of four information bits and a parity $\underline{p}=(p_0, p_1, \ldots, p_4)$ formed of five parity bits. Accordingly, a relation as shown in Equation (2) is satisfied.

$$H \cdot \underline{c}^T = \begin{bmatrix} 1 & 0 & 0 & 0 & 1 & 0 & 0 & 1 & 0 \\ 0 & 1 & 1 & 0 & 0 & 0 & 0 & 1 & 0 \\ 0 & 1 & 0 & 0 & 0 & 1 & 0 & 0 & 1 \\ 1 & 0 & 0 & 1 & 0 & 0 & 0 & 0 & 1 \\ 1 & 0 & 1 & 1 & 0 & 0 & 1 & 0 & 0 \end{bmatrix} \begin{bmatrix} m_0 \\ m_1 \\ m_2 \\ m_3 \\ p_0 \\ p_1 \\ p_2 \\ p_3 \\ p_4 \end{bmatrix} = \underline{0} \quad (2)$$

When Equation (2) is expressed as shown below in Equation (3), it becomes clear that each row of a parity check matrix is one algebraic equation. Generally, each equation of a parity check matrix is referred to as a "parity-check equation".

$$\begin{bmatrix} m_0 + p_0 + p_3 \\ m_1 + m_2 + p_3 \\ m_1 + p_1 + p_4 \\ m_0 + m_3 + p_4 \\ m_0 + m_2 + m_3 + p_2 \end{bmatrix} = \begin{bmatrix} 0 \\ 0 \\ 0 \\ 0 \\ 0 \end{bmatrix} \quad (3)$$

A non-zero element in a parity check matrix is generally referred to as a "weight". Generally, in a parity check code, as the number of weights increases, encoding and decoding complexity also increases. That is, as there are fewer weights in an entire parity check matrix, complexity reduces. Generally, a code having very weights is referred to as a Low-Density Parity-Check (LDPC) code. An LDPC code has a characteristic that the density of weights gets lower, even more as a codeword length increases.

FIG. 1 illustrates a parity check matrix according to an embodiment of the present invention.

Referring to FIG. 1, $N_1$ and $K_1$ are a codeword length and an information word length, respectively, and the length of a parity part of the codeword is represented by $(N_1-K_1)$.

A partial matrix of a parity check matrix corresponding to a parity, i.e., a structure from a $K_1$-th column to an $(N_1-1)$-th column is a dual diagonal form. Therefore, the number of weights in each column of the partial matrix corresponding to the parity is 2, except the last column, which is 1.

A partial matrix of a parity check matrix corresponding to an information word, i.e., a 0-th column to a $(K_1-1)$-th column, has a special structure on a basis of $M_1$ columns. Here, $M_1$ is a primary parameter of the parity check matrix of FIG. 1 and may change a value depending on a given system.

In FIG. 1, the partial matrix corresponding to the information word may be considered as a form grouped on a basis of $M_1$ columns. When a position of a row is determined where a weight '1' exists in an 0-th column inside each column group, a position of a row where a weight '1' exists in an i-th column inside each column group is cyclic-shifted by $i \cdot q_1 \mod(N_1-K_1)$ from a position of a row where a weight '1' exists in a 0-th column inside the each column group. Here, q1 is an integer and is set to satisfy $q_1=(N_1-K_1)/M_1$.

Figure 2:
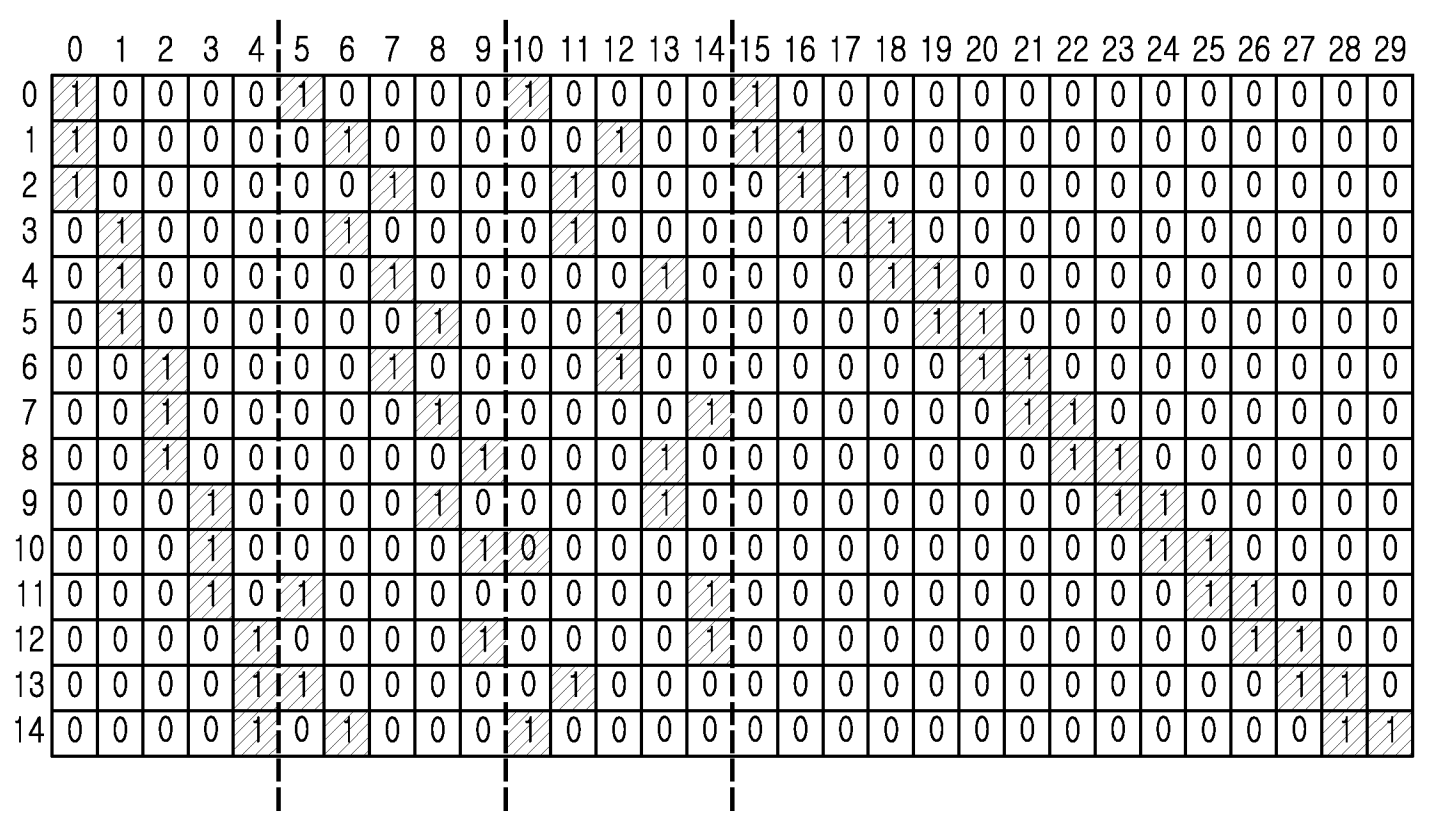

More specifically, when $N_1=30$, $K_1=15$, $M_1=5$, $q_1=3$, the number ($K_1/M_1$) of column groups is 3, and position information of a row having a weight-1 for each 0-th column of three column groups is represented as in Table 1, an LDPC code parity check matrix as illustrated in FIG. 2 is provided.

TABLE 1

| 0 | 1 | 2 |
|---|---|---|
| 0 | 11 | 13 |
| 0 | 10 | 14 |

FIG. 2 illustrates an LDPC code parity check matrix according to an embodiment of the present invention.

Referring to FIG. 2, a sequence is called a weight-1 position sequence, for convenience. A j(j=0, 1, ... ($K_1/M_1$−1))-th weight-1 position sequence represents position information of a row where a weight-1 is positioned in a 1st column inside a j-th column group sequentially.

In FIG. 2, in a first column group formed of a 0-th column to a fourth column, rows where a weight-1 is positioned in a 0-th column corresponding to a 1st column inside the 1st column group are a 1st row and a 2nd row.

In addition, rows where a weight-1 is positioned in a 1st column corresponding to a 2nd column inside the column group are 3 $(=(0+q_1) \mod (N_1-K_1))$, 4 $(=(1+q_1) \mod (N_1-K_1))$, and 5 $(=(2+q_1) \mod (N_1-K_1))$.

In addition, rows where a weight-1 is positioned in a 3rd column corresponding to a 4th column inside the column group are 9 $(=(0+3\times q_1) \mod (N_1-K_1))$, 10 $(=(1+3\times q_1) \mod (N_1-K_1))$, and 11 $(=(2+3\times q_1) \mod (N_1-K_1))$.

In FIG. 2, in a 2nd column group formed of a 5th column to a 9th column, rows where a weight-1 is positioned in a 5th column corresponding to a 1st column inside the 2nd column group are a 0-th row, an 11th row, and a 13th row.

Rows where a weight-1 is positioned in a 6th column corresponding to a 2nd column inside the column group are 1 $(=(13+q_1) \mod (N_1-K_1))$, 3 $(=(0+q_1) \mod (N_1-K_1))$, and 14 $(=(11+q_1) \mod (N_1-K_1))$.

In addition, rows where a weight-1 is positioned in a 9th column corresponding to a 5th column inside the column group are 8 $(=(11+4\times q_1) \mod (N_1-K_1))$, 10 $(=(13+4\times q_1) \mod (N_1-K_1))$, and 12 $(=(0+4\times q_1) \mod (N_1-K_1))$.

Likewise, this characteristic may be easily known with respect to other column groups.

In Table 1 above, in a 1st column group formed of a 0-th column to a 4th column, rows where a weight-1 is positioned in a 0-th column corresponding to a 1st column inside the 1st column group represent a 0-th row, a 1st row, and a 2nd row. In a 2nd column group formed of a 5th column to a 9th column, rows where a weight-1 is positioned in a 5th column corresponding to a 1st column inside the 2nd column group represent a 0-th row, an 11th row, a 13th row. In a 3rd column group formed of a 10-th column to a 14th column, rows where a weight-1 is positioned in a 10th column corresponding to a 1st column inside the 3rd column group represent a 0-th row, an 10th row, a 14th row.

A codeword of a parity check code corresponding to the parity check matrix H of Equation (1) is expressed by $c=(m_0, m_1, m_2, m_3, p_0, p_1, p_2, p_3, p_4)$. Herein, it is assumed that a broadcasting/communication system using the parity check code always punches $P_3$ and $P_4$ and transmits only the remaining bits depending on system requirements.

Accordingly, a substantial codeword received by a receiver becomes $c_{effective}=(m_0, m_1, m_2, m_3, p_0, p_1, p_2)$.

Four parity check equations represented in Equation (4) can be obtained from Equation (3).

(i) $m_0+p_0+p_3=0$ (ii) $m_1+m_2+p_3=0$ (iii) $m_1+p_1+p_4=0$ (iv) $m_0+m_3+p_4=0$  (4)

When Equation (i) and Equation (ii) are combined, and Equation (iii) and Equation (iv) are combined in Equation (4), a new parity check equation is obtained, as shown below in Equation (5).

(i)⊕(ii) ⇒ $m_0+m_2+p_0=0$ (iii)⊕(iv) ⇒ $m_0+m_1+m_3+p_1=0$  (5)

As described above, Equation (5) can be obtained from Equation (3).

Figure 3:
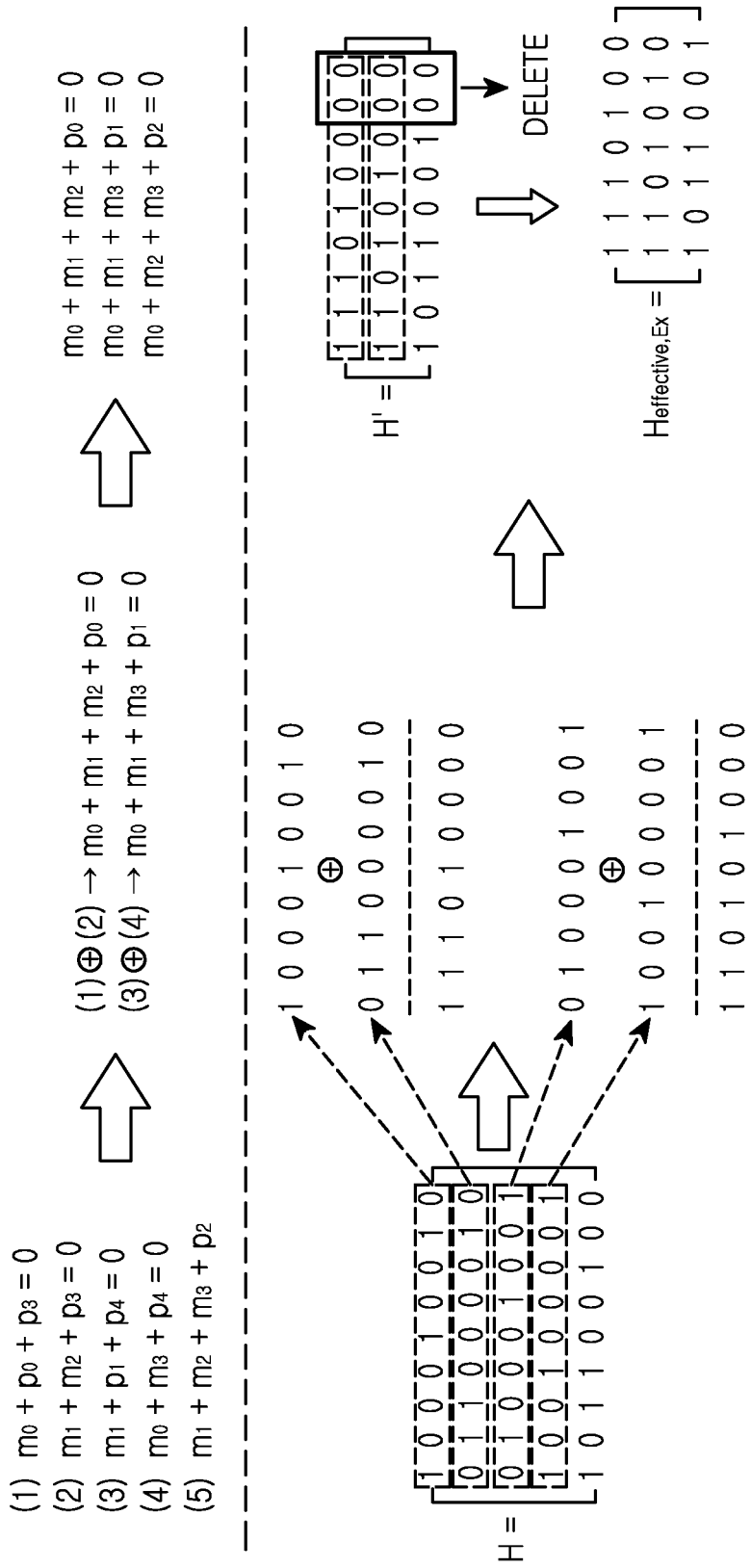
FIG. 3 illustrates a process for combining a parity check equation including a puncturing bit according to an embodiment of the present invention.

FIG. 3 illustrates a process for combining a parity check equation including a puncturing bit according to an embodiment of the present invention.

Referring to FIG. 3, in Equations (4) (5), Equations (i) and (ii), including $P_3$ in common, are combined, and Equations (iii) and (iv), including $P_4$ in common, are combined. This is the same as combining a 0-th row and a 1st row in the parity check matrix H, and combining a 2nd row and a 3rd row in the parity check matrix H.

In addition, when unnecessary columns including only 0 are removed from a new parity check matrix, where the rows are combined as described above, a new parity check matrix $H_{effective, Ex}$, as illustrated in FIG. 3 is obtained.

More specifically, when $P_3$ and $P_4$ are always punctured in the parity check matrix and a parity check code corresponding thereto is expressed in Equations (1), (2), and (3), a substantial parity check matrix becomes $H_{effective, Ex}$. That is, a receiver determines that a transmitter transmits $c_{effective,Ex}=(m_0, m_1, m_2, m_3, p_0, p_1, p_2)$ and then performs decoding using $H_{effective, Ex}$, not using H.

When decoding is performed using H, a decoding process may be performed from nine bits and five parity check equations. In this case, $P_3$ and $P_4$ are processed as erasures and decoding is performed.

However, when $P_3$ and $P_4$ are removed and decoding is performed using $H_{effective, Ex}$, because a decoding process may be performed using only seven bits and only three parity check equations, the decoding complexity is reduced.

Further, even when a transmitter always punches fixed parity bits $P_3$ and $P_4$, encoding which is performed by using $H_{effective, Ex}$, may reduce encoding complexity.

As the number of punctured bits in a given code increases, an encoding/decoding complexity reduces.

Figure 4:
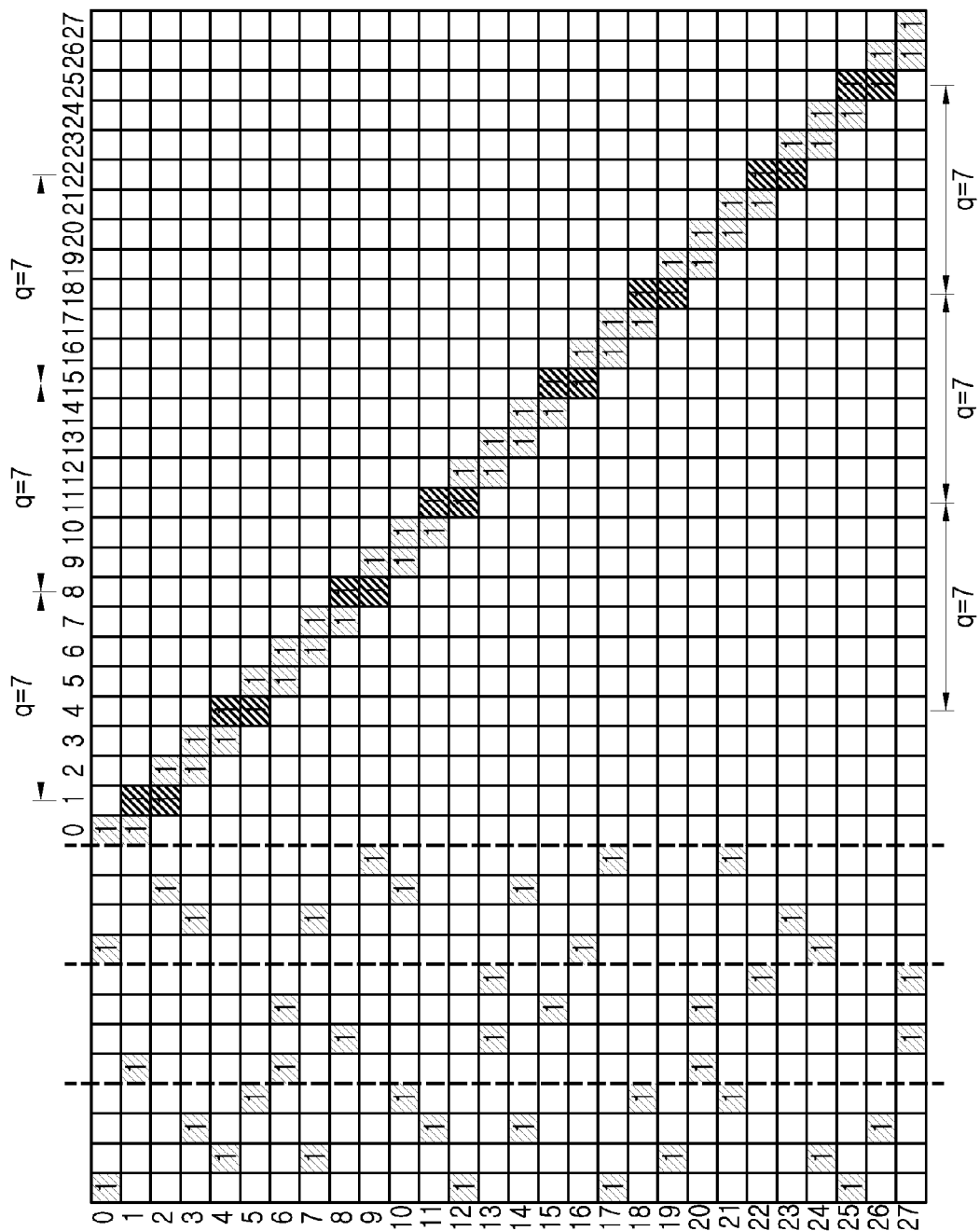
FIG. 4 illustrates an LDPC code parity check matrix according to an embodiment of the present invention.

Primary parameters are $N_1=40$, $K_1=12$, $M_1=4$, $q_1=28/4=7$ in the parity check matrix illustrated in FIG. 1, and a weight-1 position sequence is represented as illustrated in FIG. 4, in consideration of a parity check matrix represented in Table 2 below.

TABLE 2

| <weight-1 position sequence> | | | |
|---|---|---|---|
| 0 | 12 | 17 | 25 |
| 1 | 6 | 20 | |
| 0 | 16 | 24 | |

FIG. 4 illustrates an LDPC code parity check matrix according to an embodiment of the present invention.

Referring to FIG. 4, it is assumed that a parity check code having the above-described parity check matrix is punctured according to the following puncturing rules. Here, the parity bits are represented by $P_0, P_1, \ldots, P_{N_1-K_1-1}$.

Puncturing Rules

Rule 1) A parity bits to be punctured are determined from a 0-th parity bit to a $(q_1-1)$-th parity bit $P_0, P_1, \ldots, P_{q_1-1}$. The A parity bits to be punctured are denoted by $P_{x_0}, P_{x_1}, \ldots, P_{x_{(A-1)}}$ for convenience. Here, values of $x_0, x_1, x_2, \ldots$ depending on the variable A may change based on a system requirement or may be determined in advance.

Rule 2) All parity bits corresponding to $P_{x_i+q_1 \cdot j}$ are punctured with respect to i=0, 1, ..., $(M_1-1)$.

When puncturing is applied to a parity check code corresponding to the parity check matrix illustrated in FIG. 4, it is assumed that $P_1$ has been selected as a parity bit to be punctured according to Rule 1). Accordingly, parity bits corresponding to $P_1, P_8, P_{15}, P_{22}$ are punctured according to Rule 2).

Because an i-th parity bit $P_i$ in a parity check code having a parity check matrix as illustrated in FIG. 1 is simultaneously included in a parity-check equation corresponding to an i-th row and an (i+1)-th row in the parity check matrix, rows corresponding to a parity check equation including each parity bit to be punctured in the parity check matrix illustrated in FIG. 4 may be combined regularly, as described in Equations (4) and (5), and illustrated in FIG. 3. That is, a 1st row and a 2nd row may be combined, an 8th row and a 9th row may be combined, a 15th row and a 16th row may be combined, and a 22nd row and a 23rd row may be combined. A result of these combination is parity check matrix $H_{effective,2}$, as illustrated in FIG. 5.

Figure 5:
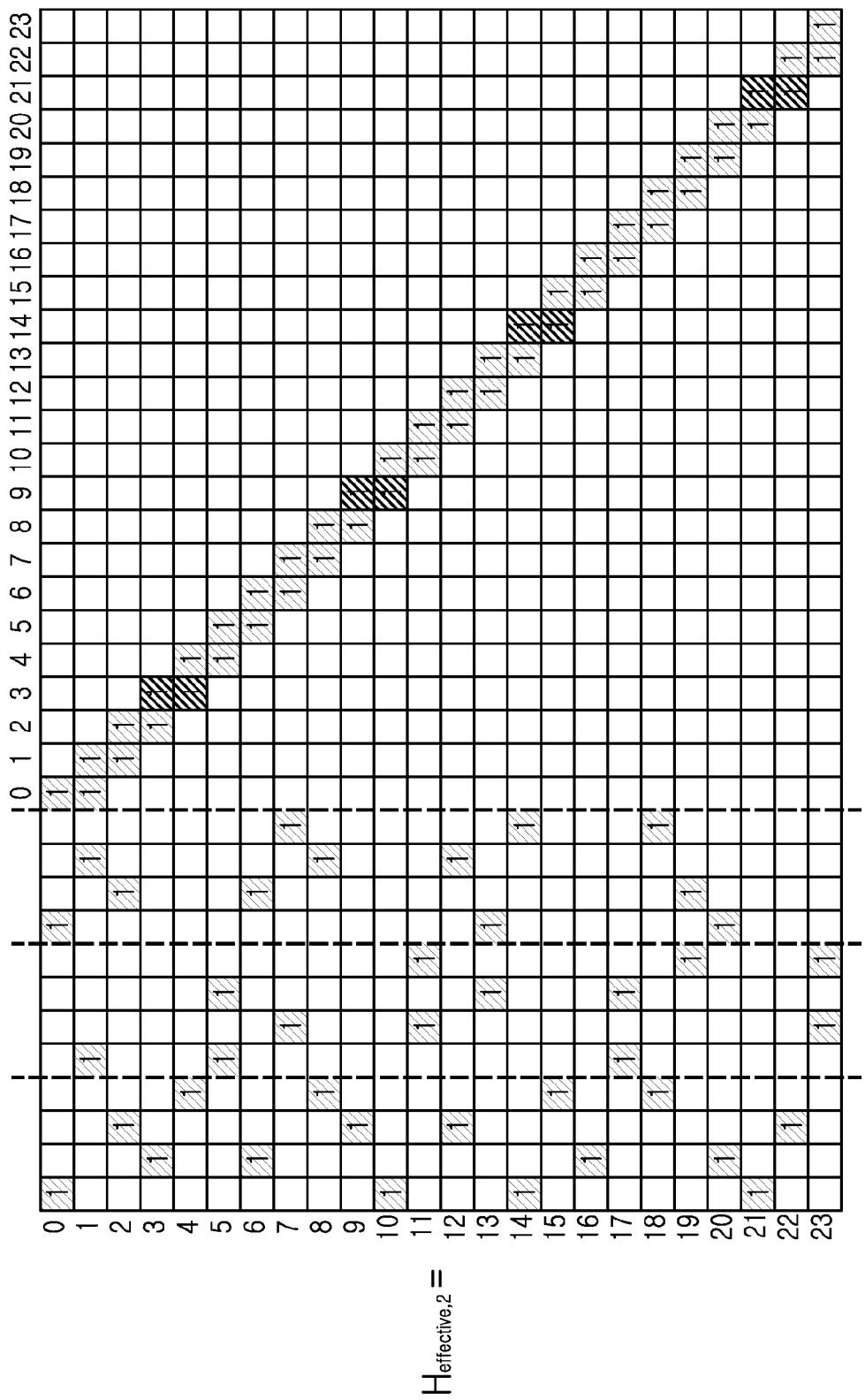
FIG. 5 illustrates a parity cheek matrix obtained via a combination of a parity check equation when puncturing is applied to one parity bit in an LDPC code according to an embodiment of the present invention.

FIG. 5 illustrates a parity check matrix obtained via a combination of a parity check equation when puncturing is applied to one parity bit in an LDPC code according to an embodiment of the present invention.

Referring to FIG. 5, because the parity check matrix $H_{effective,2}$ is obtained when punctured four parity bits are removed, a codeword length $N_2$ becomes $N_2=N_1-4=36$, and other primary parameters change to $K_2=12$, $M_2=4$, $q_2=24/4=6$. In addition, weight-1 position sequences for $H_{effective,2}$ changes, as shown in Table 3.

TABLE 3

| <weight-1 position sequence 2> | | | |
|---|---|---|---|
| 0 | 10 | 14 | 21 |
| 1 | 5 | 17 | |
| 0 | 13 | 20 | |

Accordingly, when parity bits corresponding to P1, P8, P15, and P22 are always punctured according to the above-described puncturing rules in a parity check code corresponding to the parity check matrix illustrated in FIG. 4, encoding/decoding may be performed using a parity check code that uses the parity check matrix $H_{effective,2}$ corresponding to <weight-1 position sequence 2>.

When $P_1$ is determined as a parity bit to be punctured and combining a 1st row and a 2nd row is performed first, a 2nd row is removed from a parity check matrix corresponding to <weight-1 position sequence 1>.

Because <weight-1 position sequence 1> represents information of a row where weight-1s are positioned, when one row of a specific position is removed, a position information value corresponding to rows existing below the specific position reduces by one.

Therefore, all values corresponding to a number equal to or greater than 2 in <weight-1 position sequence 1> should be reduced by 1.

Likewise, when $P_8$ is determined as a parity bit to be punctured and an 8th row and a 9th row are combined, a 9th row is removed from a parity check matrix corresponding to <weight-1 position sequence 1>. Therefore, all values corresponding to a number greater than or equal to 9 in <weight-1 position sequence 1> should be additionally reduced by 1.

Likewise, when $P_{15}$ is determined as a parity bit to be punctured and a 15th row and a 16th row are combined, a 16th row is removed from a parity check matrix corresponding to <weight-1 position sequence 1>. Therefore, all values corresponding to a number greater than or equal to than 16 in <weight-1 position sequence 1> should be additionally reduced by 1.

Likewise, when $P_{22}$ is determined as a parity bit to be punctured and a 22nd row and a 23rd row are combined, a 23rd row is removed from a parity check matrix corresponding to <weight-1 position sequence 1>. Therefore, all values corresponding to a number greater than or equal to 23 in <weight-1 position sequence 1> should be additionally reduced by 1.

These processes are summarized in steps 1-6 below.

1) Set $P_1, P_8, P_{15}$, and $P_{22}$ as parity bits to be punctured.
2) Do not change numbers that are greater than or equal to 0, and less than or equal to 1 in <weight-1 position sequence 1>.
3) Apply −1 to numbers that are greater than 1 and less than or equal to 8 in <weight-1 position sequence 1>.
4) Apply −2 to numbers that are greater than 8 and less than or equal to 15 in <weight-1 position sequence 1>.
5) Apply −3 to numbers that are greater than 15 and less than or equal to 22 in <weight-1 position sequence 1>.
6) Apply −4 to numbers that are greater than 22 in <weight-1 position sequence 1>.

<weight-1 position sequence 2> can be obtained via the above-described process.

Assuming that $P_1$ and $P_4$ have been selected as a parity bit to be punctured according to Rule 1) when puncturing is applied to a parity check code corresponding to a parity check matrix illustrated in FIG. 4, when a plurality of parity bits like this are punctured, <weight-1 position sequence 1> is obtained for the process with respect to $P_1$, and then a changed weight-1 position sequence may be obtained via the same process.

Specifically, because a parity bit $P_4$ punctured in a parity check code corresponding to <weight-1 position sequence 1> is obtained from <weight-1 position sequence 2> by removing a punctured parity bit $P_1$, it is like removal of one parity bit punctured before $P_4$, so that $P_4$ corresponds to a punctured parity bit $P_3$ in a parity check code corresponding to <weight-1 position sequence 2>.

Referring again to FIG. 5, a conversion process of the weight-1 sequence additionally applied to a parity check matrix corresponding to <weight-1 position sequence 2> will described below in steps 1-6.

1) Set $P_3$, $P_9$, $P_{15}$, and $P_{21}$ as parity bits to be punctured.

2) Do not change numbers that are greater than or equal to 0, and less than or equal to 3 in <weight-1 position sequence 2>.

3) Apply −1 to numbers that are greater than 3 and less than or equal to 9 in <weight-1 position sequence 2>.

4) Apply −2 to numbers that are greater than 9 and less than or equal to 15 in <weight-1 position sequence 2>.

5) Apply −3 to numbers that are greater than 15 and less than or equal to 21 in <weight-1 position sequence 2>.

6) Apply −4 to numbers that are greater than 21 in <weight-1 position sequence 2>.

$P_3$, $P_9$, $P_{15}$, and $P_{21}$ are set as parity bits to be punctured because a change of $q_2=6$ has been made when Rule 2) is applied. Accordingly, weight-1 sequences obtained from the above process may be represented as follows.

Figure 6:
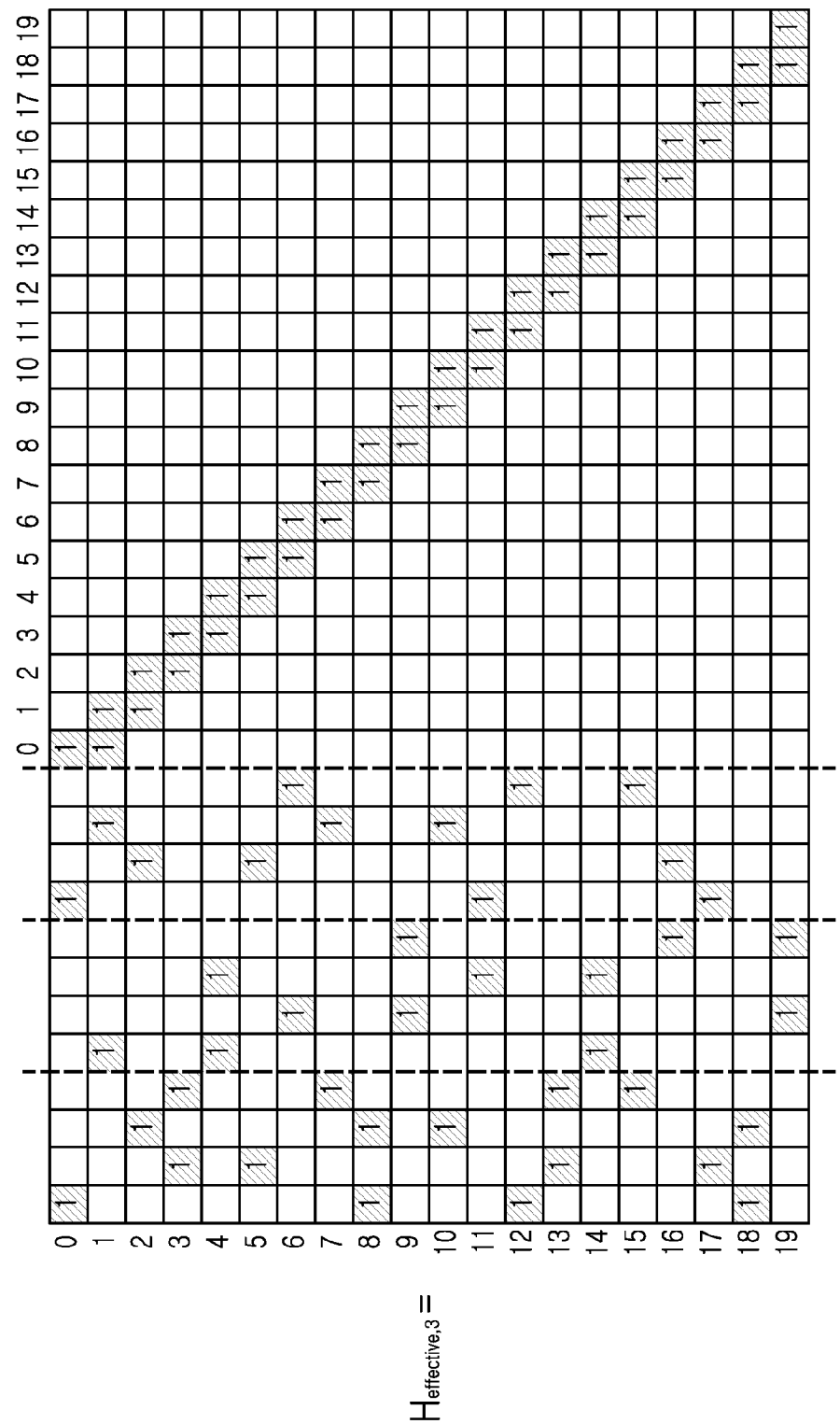
FIG. 6 illustrates a parity check matrix obtained via combinations of a parity check equation when puncturing is applied to two parity bits in an LDPC code according to an embodiment of the present invention.

FIG. 6 illustrates a parity check matrix obtained via combinations of a parity check equation when puncturing is applied to two parity bits in an LDPC code according to an embodiment of the present invention.

Referring to FIG. 6, <weight-1 position sequence 3> is given by Table 4.

TABLE 4

| 0 | 8  | 12 | 18 |
|---|----|----|----|
| 1 | 4  | 14 |    |
| 0 | 11 | 17 |    |

The primary parameters of the parity check matrix $H_{effective,3}$ are $N_3=32$, $K_3=12$, $M_3=4$, and $q_3=20/4=5$.

When the above-described processes are sequentially applied when applying the above-described puncturing rules, a parity check matrix from which punctured parity bits is removed or a weight-1 position sequence corresponding thereto may be obtained.

Generally, when applying the above-described puncturing rules to a parity check matrix or a parity check code corresponding to a given first weight-1 position sequence, a process for obtaining a second weight-1 position sequence via a conversion process of a weight-1 position sequence may be summarized as shown in steps 1-8 below.

<Second Weight-2 Position Sequence Conversion Process>

Step 1) Do not change numbers that are greater than or equal to 0, and less than or equal to $x_0$ in a first weight-1 position sequence.

Step 2) Apply −j to all of numbers that are greater than $x_0+q_1 \cdot (j-1)$ and less than or equal to $x_0+q_1 \cdot j$ with respect to j=1, 2, . . . , ($M_1$−1).

Step 3) Apply −$M_1$ to numbers that are greater than $x_0+q_1 \cdot (M_1-1)$.

Step 4) Replace the first weight-1 sequence by a weight-1 position sequence newly obtained from Steps 1), 2), and 3).

Step 5) replace like $q_1 \leftarrow (q_1-1)$.

Step 6) replace like A←(A−1). When A≥1 is met, perform Step 7) and Step 8). When A≥1 is not met, store a finally obtained weight-1 position sequence as a second weight-1 sequence, and store a final $q_1$ as $q_{effective}$.

Step 7) Sequentially replace like $x_{i-1} \leftarrow (x_i-1)$ with respect to i=1, . . . , A.

Step 8) repeat Steps 1) to 7).

Consequently, when applying the above-described puncturing rules to a parity check matrix or a parity check code corresponding to a first weight-1 sequence, where primary parameters are $N_1$, $K_1$, $M_1$, and $q_1$, when <weight-1 position sequence conversion process> is applied, a second weight-1 sequence corresponding to a parity check matrix or a parity check code from which an influence of a punctured parity bit has been removed may be obtained.

In addition, a parity check matrix obtained via the <weight-1 position sequence conversion process> or primary parameters representing a parity check code are changed as shown below in Equation (6).

$$N_{effective}=N_1-AM_1, K_{effective}=K_1, M_{effective}=M_1,$$
$$q_{effective}=q_1-A \quad (6)$$

Digital Video Broadcasting—Second Generation Terrestrial (DVB-T2), which is a standard for use in Europe, encodes and decodes using an LDPC code having a parity check matrix as illustrated in FIG. 1.

Referring again to FIG. 1, primary parameters of an LDPC code used for the DVB-T2 are $N_1=16200$, $K_1=3240$, and $M_1=360$, $q_1=36$, and have weight-1 position sequences of Table 5.

TABLE 5

<weight position sequence: DVB-T2>

| 6295  | 9626  | 304   | 7695  | 4839 | 4936  | 1660 | 144   | 11203 | 5567  | 6347 | 12557 |
| 10691 | 4988  | 3859  | 3734  | 3071 | 3494  | 7687 | 10313 | 5964  | 8069  | 8296 | 11090 |
| 10774 | 3613  | 5208  | 11177 | 7676 | 3549  | 8746 | 6583  | 7239  | 12265 | 2674 | 4292  |
| 11869 | 3708  | 5981  | 8718  | 4908 | 10650 | 6805 | 3334  | 2627  | 10461 | 9285 | 11120 |
| 7844  | 3079  | 10773 |       |      |       |      |       |       |       |      |       |
| 3385  | 10854 | 5747  |       |      |       |      |       |       |       |      |       |
| 1360  | 12010 | 12202 |       |      |       |      |       |       |       |      |       |
| 6189  | 4241  | 2343  |       |      |       |      |       |       |       |      |       |
| 9840  | 12726 | 4977  |       |      |       |      |       |       |       |      |       |

A j-th weight-1 position sequence in the weight-1 position sequence sequentially represents position information of a row where weight-1 is positioned in a 0-th column inside a j-th column group.

Physical layer signaling called "L1-pre signaling" exists in DVB-T2 and is formed of information word bits of 200 bits.

The DVB-T2 L1-pre signaling performs encoding by concatenating a Bose-Chaudhuri-Hocquenghem (BCH) code and an LDPC code. Here, the encoding method may be performed using two methods. A first method performs zero-padding on 2872 bits having a value of 0 in the L1-pre signaling to perform BCH encoding on 3072 bits in total and generates a BCH parity of 168 bits, and may perform LDPC encoding using the weight-1 position sequence of Table 5. A second method performs BCH encoding on L1-pre signaling of 200 bits to generate a BCH parity of 168 bits, and may perform zero-padding on 2872 bits having a value of 0 in a BCH code of 368 bits in total to perform LDPC encoding on 3240 bits in total.

In the two above-described encoding methods, zero-padded 2872 bits are not transmitted when a transmission terminal finally transmits the bits to a reception terminal.

An LDPC code corresponding to the <weight-1 position sequence DVB-T2> generates $(N_1-K_1)=12960$ parity bits. A DVB-T2 system punctures 11488 parity bits among the generated 12960 parity bits to perform L1-pre signaling. Therefore, encoded L1-pre signaling finally transmitted from a transmission terminal to a reception terminal is formed of 1840 (=368+1472) bits.

The DVB-T2 system applies a puncturing method similar to the above-described puncturing rules. More particularly, the DVB-T2 system applies puncturing to 11160(=360×31) parity bits of the punctured 11488 parity bits according to the above-described puncturing rules, as will be described below.

1) 31 parity bits to be punctured are determined from a 0-th parity bit to a 35th parity bit $P_0, P_1, \ldots, P_{35}$. The 31 parity bits to be punctured are:

P0, P2; P3, P4, P5, P7, P8, P9, P10, P11, P12
P13, P14, P16, P17, P18, P19, P20, P21, P22, P24,
P25, P26, P27, P28, P29, P31, P32, P33, P34, P35.

2) All parity bits corresponding to $P_{x_i+36j}$ are punctured with respect to $i=0, 1, \ldots, 30$, $j=0, 1, \ldots, 359$, on the assumption that $x_0=0$, $x_1=2$, $x_2=3$, $x_3=4$, $x_4=5$, $x_5=7$, $x_6=8$, $x_7=9$, $x_8=10$, $x_9=11$, $x_{10}=12$, $x_{11}=13$, $x_{12}=14$, $x_{13}=16$, $x_{14}=17$, $x_{15}=18$, $x_{16}=19$, $x_{17}=20$, $x_{18}=21$, $x_{19}=22$, $x_{20}=24$, $x_{21}=25$, $x_{22}=26$, $x_{23}=27$, $x_{24}=28$, $x_{25}=29$, $x_{26}=31$, $x_{27}=32$, $x_{28}=33$, $x_{29}=34$, and $x_{30}=35$.

When <weight-1 position sequence conversion process> is applied to <weight-1 position sequence DVB-T2> while the above-described parity puncturing is performed, a changed weight-1 position sequence as shown in Table 6 can be obtained.

TABLE 6

<first changed weight-1 position sequence: DVB-T2>

| | | | | | | | | | | | |
|---|---|---|---|---|---|---|---|---|---|---|---|
| 875 | 1337 | 43 | 1069 | 672 | 686 | 231 | 20 | 1557 | 773 | 882 | 1744 |
| 1485 | 693 | 537 | 519 | 427 | 486 | 1068 | 1433 | 829 | 1121 | 1153 | 1541 |
| 1497 | 502 | 724 | 1553 | 1067 | 493 | 1215 | 915 | 1006 | 1704 | 372 | 597 |
| 1649 | 515 | 831 | 1211 | 682 | 1479 | 945 | 463 | 365 | 1453 | 1290 | 1545 |
| 1090 | 428 | 1497 | | | | | | | | | |
| 470 | 1508 | 798 | | | | | | | | | |
| 189 | 1668 | 1695 | | | | | | | | | |
| 860 | 589 | 326 | | | | | | | | | |
| 1367 | 1768 | 692 | | | | | | | | | |

A parity check matrix or primary parameters of a parity check code corresponding to the <changed weight-1 position sequence: DVB-T2> are changed as shown in Equation (7).

$$N_{effective}=5040, K_{effective}=3240, M_{effective}=360,$$
$$q_{effective}=5 \quad (7)$$

Consequently, when a DVB-T2 applies puncturing to 11488 parity bits using an LDPC code corresponding to <weight-1 position sequence: DVB-T2>, parity check equations including 11160(=360×31) parity bits punctured using the same method as the above-described puncturing rules among punctured 11488 parity bits are combined, so that an LDPC code corresponding to <first changed weight-1 position sequence: DVB-T2> can be obtained. When puncturing is additionally applied to only 328 (=11488−360×31) parity bits after encoding is performed using an LDPC code corresponding to <first changed weight-1 position sequence: DVB-T2>, the same effect can be obtained as if puncturing were applied to 11488 parity bits using an LDPC code corresponding to <weight-1 position sequence: DVB-T2>.

A process for performing encoding on DVB-T2 L1-pre signaling using <first changed weight-1 position sequence: DVB-T2> of Table 6 may be summarized below.

A first method includes performing zero-padding on 2872 bits having a value of 0 in the L1-pre signaling of 200 bits to perform BCH encoding on 3072 bits in total and generate a BCH parity of 168 bits, performs LDPC encoding on the generated BCH codeword of 3240 bits using <first changed weight-1 position sequence: DVB-T2> of Table 6, and puncturing 328 parity bits of the generated LDPC parity bits.

A second method includes performing BCH encoding on L1-pre signaling of 200 bits to generate a BCH parity of 168 bits, performing zero-padding on 2872 bits having a value of 0 in a BCH codeword of 368 bits in total to perform LDPC encoding on 3240 bits in total using <first changed weight-1 position sequence: DVB-T2> of Table 6, and then puncturing 328 parity bits of the generated LDPC parity bits.

In the two above-described encoding methods, zero-padded 2872 bits are not transmitted when a transmission terminal finally transmits the bits to a reception terminal. Therefore, encoded L1-pre signaling finally transmitted from a transmission terminal to a reception terminal are 1840 bits, which are the same as the conventional DVB-T2 system.

When encoding is performed using an LDPC code corresponding to <first changed weight-1 position sequence: DVB-T2>, because a generation process for 11160 parity bits is not required, encoding complexity is reduced. In addition, because a process operation for 11160 parity bits is not required during decoding, operation complexity reduces and a required memory reduces.

Because the length of the L1-pre signaling is fixed as 200 in the DVB-T2, shortening for an information word portion is applied for BCH encoding or LDPC encoding. For example, DVB-T2 performs padding on 2872 bits having a value of 0 for encoding of the L1-pre signaling. Particularly, 2520 bits of the zero-padded 2872 bits correspond to information word bits corresponding to all column groups, except a 0-th column group and an 8th column group in a parity check matrix of an LDPC code.

Because limiting a value of an information word bit to 0 has the same effect as if the relevant column were not substantially used in the parity check matrix, the relevant columns may be removed. Therefore, weight-1 position sequences corresponding to all column groups except the 0-th column group and the 8th column group, a zero-padding operation for 2520 bits is not required during encoding. In addition, because removed weight-1 position sequences do not need to be considered during decoding, encoding/decoding efficiency is improved.

For example, more efficient encoding/decoding may be performed using <second changed weight-1 position sequence: DVB-T2> of Table 7 formed of sequences except 0-th and 8th weight-1 position sequences in <first changed weight-1 position sequence: DVB-T2>.

TABLE 7

<second changed weight-1 position sequence: DVB-T2>

| 875 | 1337 | 43 | 1069 | 672 | 686 | 231 | 20 | 1557 | 773 | 882 | 1744 |
|---|---|---|---|---|---|---|---|---|---|---|---|
| 1367 | 1768 | 692 | | | | | | | | | |

Primary parameters for an LDPC code corresponding to <second changed weight-1 position sequence: DVB-T2> are $N'_{effective}=2520$, $K'_{effective}=720$, $M'_{effective}=360$, $q'_{effective}=5$ Therefore, a codeword that is completely same as the DVB-T2 may be generated by applying additional shortening and puncturing to a parity check matrix or a parity check code corresponding to <second changed weight-1 position sequence: DVB-T2>.

A process for performing encoding on DVB-T2 L1-pre signaling using <second changed weight-1 position sequence: DVB-T2> of Table 7 may be summarized below.

A first method includes performing zero-padding on 352 bits having a value of 0 in the L1-pre signaling of 200 bits to perform BCH encoding on 552 bits in total and generate a BCH parity of 168 bits, performing LDPC encoding on the generated BCH codeword of 720 bits using <second changed weight-1 position sequence: DVB-T2> of Table 7, and then puncturing 328 parity bits of the generated LDPC parity bits.

A second method includes performing BCH encoding on L1-pre signaling of 200 bits to generate a BCH parity of 168 bits, performing zero-padding on 352 bits having a value of 0 in a BCH codeword of 368 bits in total to perform LDPC encoding on 720 bits in total using <second changed weight-1 position sequence: DVB-T2> of Table 7, and then puncturing 328 parity bits of the generated LDPC parity bits.

In the two above-described encoding methods, zero-padded 352 bits are not transmitted when a transmission terminal finally transmits the bits to a reception terminal. Therefore, encoded L1-pre signaling finally transmitted from a transmission terminal to a reception terminal are 1840 bits, which are the same as the conventional DVB-T2 system.

Figure 7:
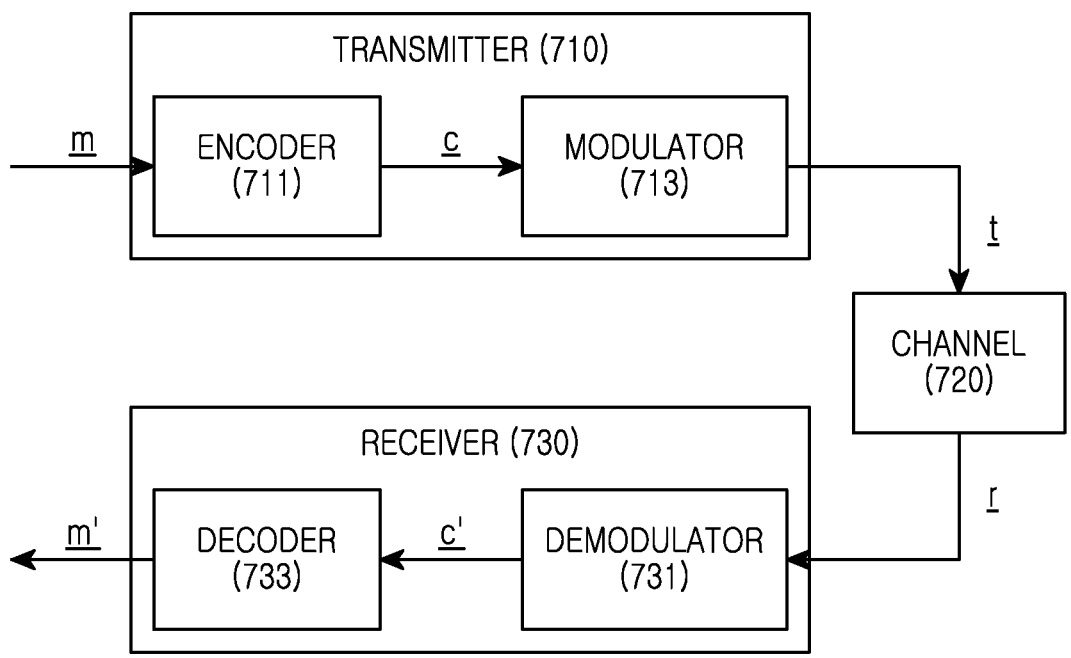
FIG. 7 illustrates a transceiver of a broadcasting/communication system according to an embodiment of the present invention.

FIG. 7 illustrates a transceiver of a broadcasting/communication system according to an embodiment of the present invention.

Referring to FIG. 7, the transceiver includes a transmitter 710 and a receiver 730. The transmitter 710 includes an encoder 711 and a modulator 713, and the receiver includes a demodulator 731 and a decoder 733.

A message or an information word m is input to the encoder 711, which encodes m into an encoded signal c, and then output the encoded signal c to the modulator 713. The modulator 713 modulates the encoded signal c into a modulated signal t, which is transmitter to the receiver 730 via channel 720.

The demodulator 731 of the receiver 730 demodulates a signal r into demodulated signal c', which is output to the decoder 733. The decoder 733 decodes the demodulated signal c' and estimates an estimation value m' of a message.

Figure 8:
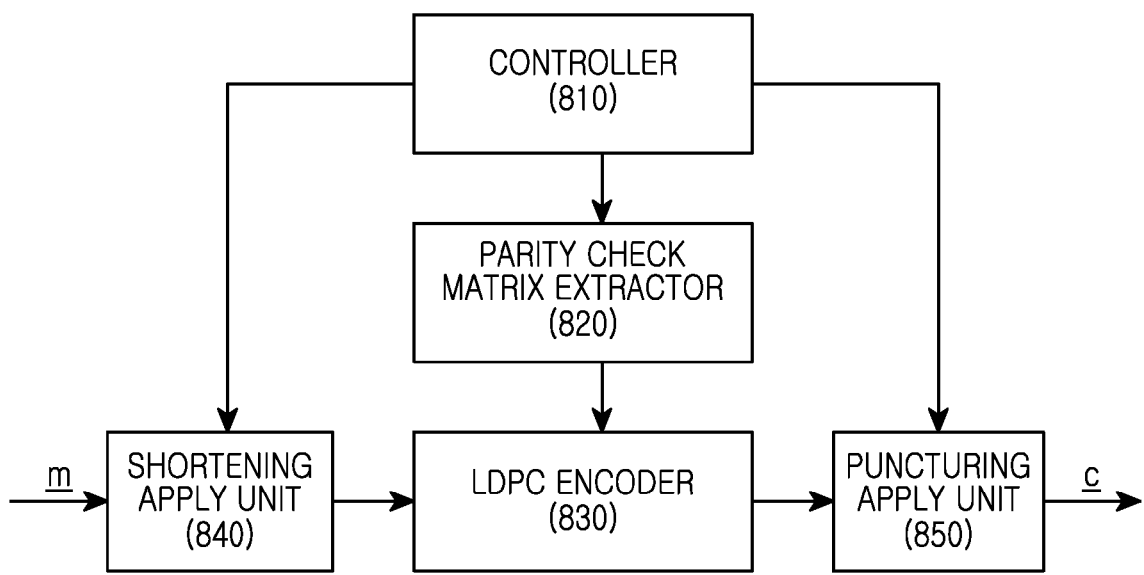
FIG. 8 illustrates an encoder of a transmitter according to an embodiment of the present invention.

FIG. 8 illustrates an encoder of a transmitter according to an embodiment of the present invention.

Referring to FIG. 8, encoder includes a controller 810, a parity check matrix extractor 820, an LDPC encoder 830, a shortening apply unit 840, and an puncturing apply unit 850. Alternatively, the shortening apply unit 840 and the puncturing apply unit 850 may be included in the LDPC encoder 830.

The controller 810 controls the parity check matrix extractor 820, the LDPC encoder 830, the shortening apply unit 840, and the puncturing apply unit 850. Alternatively, the controller 810 may perform the functions of the parity check matrix extractor 820, the LDPC encoder 830, the shortening apply unit 840, and the puncturing apply unit 850.

When shortening is performed to apply LDPC encoding to a message m, the shortening apply unit 840 performs shortening under control of the controller 810. When shortening is not required, the shortening apply unit 840 may be omitted.

The LDPC encoder 830 performs LDPC encoding using a parity check matrix determined by the parity check matrix extractor 820 under control of the controller 810.

When puncturing is required, puncturing is applied via the puncturing apply unit 850 under control of the controller 810 and an encoded signal c is transferred to a modulator.

Likewise, when puncturing is not required, the puncturing apply unit 850 may be omitted.

The parity check matrix extractor 820 may include various parity check matrixes, and information regarding the parity check matrixes may be stored in variety of forms, e.g., a weight-1 position sequence may be used.

In addition, the parity check matrix extractor 820 may store a parity check matrix obtained via <weight-1 position sequence conversion process> as described above.

Figure 9:
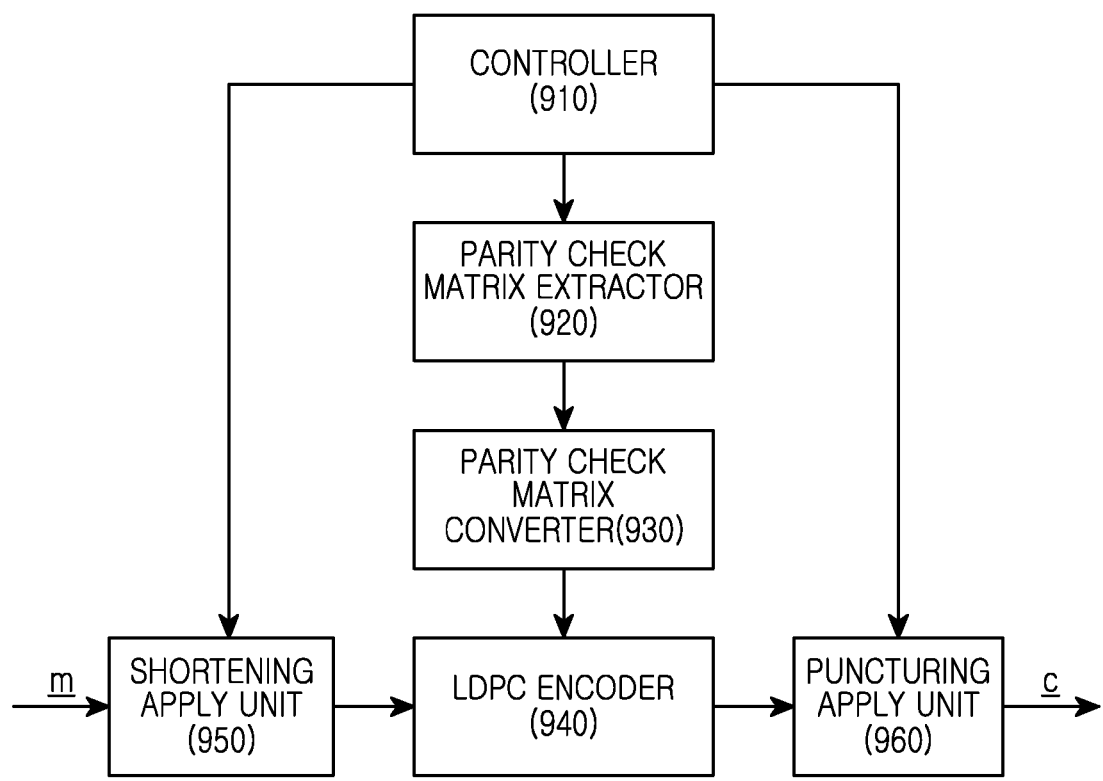
FIG. 9 illustrates an encoder of a transmitter according to an embodiment of the present invention.

FIG. 9 illustrates an encoder of a transmitter according to an embodiment of the present invention.

Referring to FIG. 9, the encoder includes a controller 910, a parity check matrix extractor 920, a parity check matrix converter 930, an LDPC encoder 940, a shortening apply unit 950, and a puncturing apply unit 960. The controller 910 controls the parity check matrix extractor 920, the parity check matrix converter 930, the LDPC encoder 940, the shortening apply unit 950, and the puncturing apply unit 960. Alternatively, the controller 910 may perform functions of the parity check matrix extractor 920, the parity check matrix converter 930, the LDPC encoder 940, the shortening apply unit 950, and the puncturing apply unit 960.

The functions of the parity check matrix extractor 920, the shortening apply unit 950, the LDPC encoder 940, and the puncturing apply unit 960 are the same as those of the parity check matrix extractor 820, the shortening apply unit 840, the LDPC encoder 830, and the puncturing apply unit 850 illustrated in FIG. 8. Accordingly, a repetitive description is omitted.

The controller 910 controls the function of the parity check matrix converter 930. So as to not directly store the parity check matrix obtained via <weight-1 position sequence conversion process>, the parity check matrix converter 930 is directly applied to the system to directly apply a conversion operation to an initial given parity check matrix, so that the system may use the converted parity check matrix.

Figure 10:
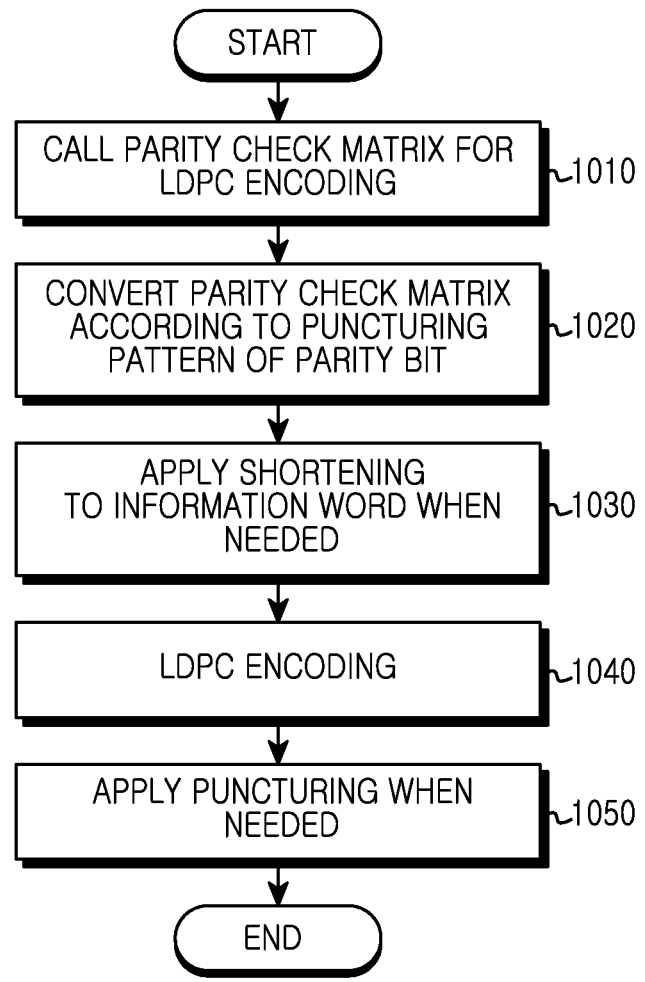
FIG. 10 is a flowchart illustrating an operation process of a transmitter according to an embodiment of the present invention.

FIG. 10 is a flowchart illustrating an operation process of a transmitter according to an embodiment of the present invention. Specifically, FIG. 10 illustrates an operation process of the encoder of the transmitter illustrated in FIG. 9.

Referring to FIG. 10, the parity check matrix extractor 920 stores and calls a parity check matrix obtained via <weight-1 position sequence conversion process> in step 1010.

Not to directly store the parity check matrix obtained via <weight-1 position sequence conversion process>, the parity check matrix converter 930 directly applies conversion to an initially given parity check matrix, and the system may use the converted parity check matrix in step 1020.

When shortening is performed to apply LDPC encoding to a message m, the shortening apply unit 950 performs shortening under control of the controller 910 in step 1030.

The LDPC encoder 830 performs LDPC encoding using the parity check matrix determined by the parity check matrix extractor 920 under control of the controller 910 in step 1040.

When puncturing is performed, the puncturing apply unit 950 applies puncturing to a result value on which LDPC encoding has been performed to transfer the punctured, encoded signal to a modulator in step 1050.

When the operation of the parity check matrix converter 930 is omitted and a converted parity check matrix is directly stored and used as illustrated in FIG. 8, step 1020 may be omitted.

In addition, the sequence of steps 1010, 1020, and 1030 may change depending on a system, or may even be simultaneously performed.

Figure 11:
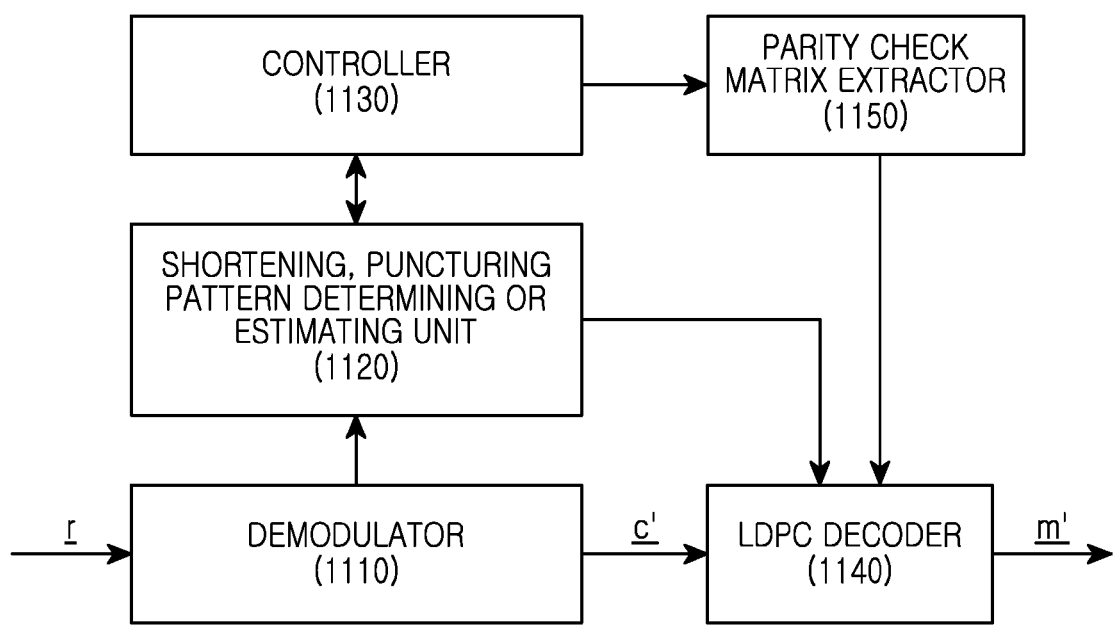
FIG. 11 illustrates a receiver according to an embodiment of the present invention.

FIG. 11 illustrates a receiver according to an embodiment of the present invention.

Referring to FIG. 11, the receiver includes a demodulator 1110, a shortening, puncturing pattern determining, or estimating unit 1120, a controller 1130, a parity check matrix extractor 1150, and an LDPC decoder 1140. The controller 1130 controls the demodulator 1110, the shortening, puncturing pattern determining or estimating unit 1120, the parity check matrix extractor 1150, and the LDPC decoder 1140. Alternatively, the controller 1130 may perform functions of the demodulator 1110, the shortening, puncturing pattern determining or estimating unit 1120, the parity check matrix extractor 1150, and the LDPC decoder 1140.

The demodulator 1110 receives and demodulates a shortened or punctured LDPC code, transfers a portion of the demodulated signal to the shortening, puncturing pattern determining or estimating unit 1120, and transfers a portion of the demodulated signal to the LDPC decoder 1140.

The shortening, puncturing pattern determining or estimating unit 1120 estimates or determines information regarding a puncturing or shortening pattern of an LDPC code from the demodulated signal, and transfers position information of the punctured and shortened bit to the LDPC decoder 1140 under control of the controller 1130.

A method for using a puncturing and shortening pattern stored using a memory, or a method for generating a puncturing and shortening pattern using a generation method realized in advance may be used by the shortening, puncturing pattern determining or estimating unit 1120 to determine or estimate a puncturing, shortening pattern.

The controller 1130 controls the parity check matrix extractor 1150 to transfer information regarding an appropriate parity check matrix to the LDPC decoder 1140 for decoding. For example, the parity check matrix extractor 1150 may store in advance and use a parity check matrix obtained via <weight-1 position sequence conversion process> for reducing unnecessary encoding/decoding complexity.

Generally, the LDPC decoder 1140 processes a punctured bit as erasure to perform decoding. When puncturing or shortening is not required from a parity check matrix obtained via <weight-1 position sequence conversion process>, the role of the shortening, puncturing pattern determining or estimating unit 1120 may be omitted or changed.

Figure 12:
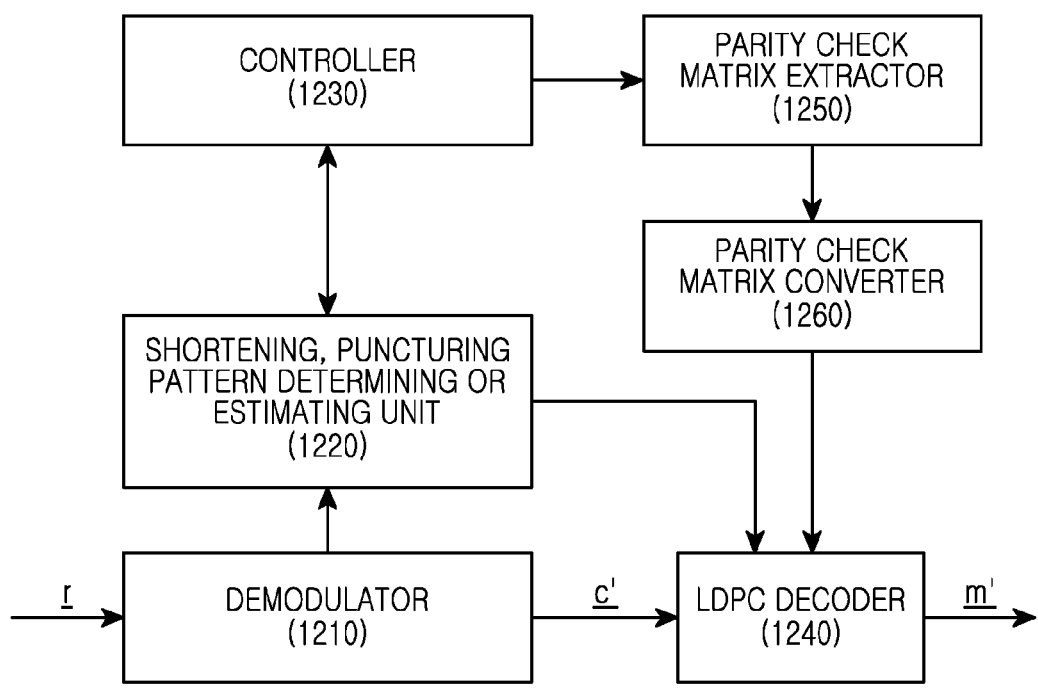
FIG. 12 illustrates a receiver according to an embodiment of the present invention.

FIG. 12 illustrates a receiver according to an embodiment of the present invention.

Referring to FIG. 12, the receiver includes a demodulator 1210, a shortening, puncturing pattern determining or estimating unit 1220, a controller 1230, a parity check matrix extractor 1250, a parity check matrix converter 1260, and an LDPC decoder 1240. The controller 1230 controls the demodulator 1210, the shortening, puncturing pattern determining or estimating unit 1220, the parity check matrix extractor 1250, the parity check matrix converter 1260, and the LDPC decoder 1240. Alternatively, the controller 1230 may perform functions of the demodulator 1210, the shortening, puncturing pattern determining or estimating unit 1220, the parity check matrix extractor 1250, the parity check matrix converter 1260, and the LDPC decoder 1240.

The functions of the demodulator 1210, the shortening, puncturing pattern determining or estimating unit 1220, the LDPC decoder 1240 are the same as the demodulator 1110, the shortening, puncturing pattern determining or estimating unit 1120, the LDPC decoder 1140, as described above. Accordingly, a repetitive description of these units omitted.

When the parity check matrix extractor 1250 does not directly store the parity check matrix obtained via <weight-1 position sequence conversion process>, the parity check matrix converter 1260 may be directly applied to the system to allow the LDPC decoder 1240 of the system to use a converted parity check matrix obtained by applying <weight-1 position sequence conversion process> to an initially given parity check matrix.

When the transmitter applies both shortening and puncturing, the shortening, puncturing pattern determining or estimating units 1120 and 1220 in FIGS. 11 and 12, respectively, perform determination or estimation of a pattern for shortening first, perform determination or estimation of a pattern for puncturing first, or simultaneously perform determination or estimation of a pattern for shortening and determination or estimation of a pattern for puncturing.

In addition, the shortening, puncturing pattern determining or estimating units 1120 and 1220 determine whether a punctured bit exists via a portion of a demodulated signal. When the punctured bit exists, shortening, puncturing pattern determining or estimating units 1120 and 1220 estimate information regarding the puncturing pattern to determine the position of a punctured parity bit.

For a system in which shortening or puncturing is not applied, the roles of the shortening, puncturing pattern determining or estimating units 1120 and 1220 may be omitted or changed.

Figure 13:
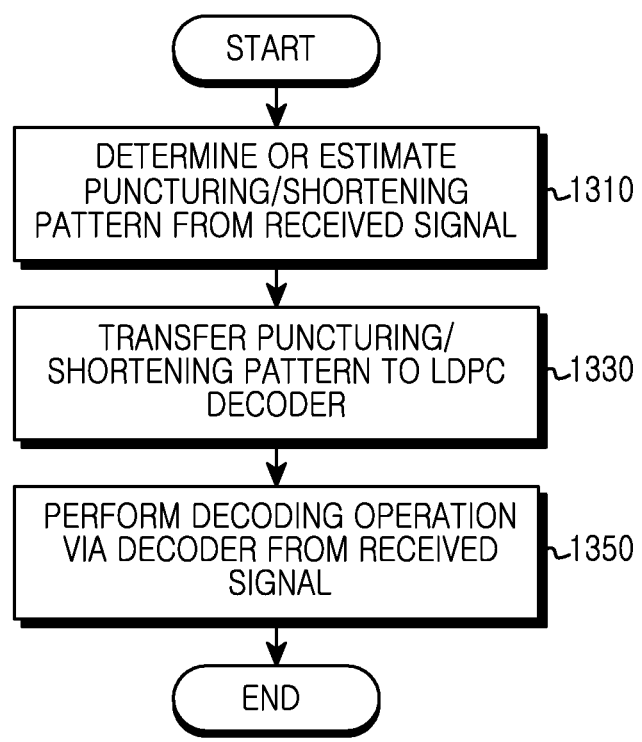
FIG. 13 is a flowchart illustrating an operation process of a receiver according to an embodiment of the present invention.

FIG. 13 is a flowchart illustrating an operation process of a receiver according to an embodiment of the present invention.

Referring to FIG. 13, when puncturing or shortening is applied in a given broadcasting/communication system, the shortening, puncturing pattern determining or estimating unit determines or estimates a puncturing or shortening pattern from a received signal in step 1310.

The shortening, puncturing pattern determining or estimating unit transfers the puncturing or shortening pattern to an LDPC decoder in step 1330, and the LDPC decoder decodes a received signal using the puncturing or shortening pattern in step 1350.

Here, the parity check matrix used may be the parity check matrix obtained via <weight-1 position sequence conversion process>. Because decoding is performed using the converted parity check matrix, when puncturing or shortening is not applied in a given broadcasting/communication system, steps 1310 and 1330 may be changed and/or omitted.

Figure 14:
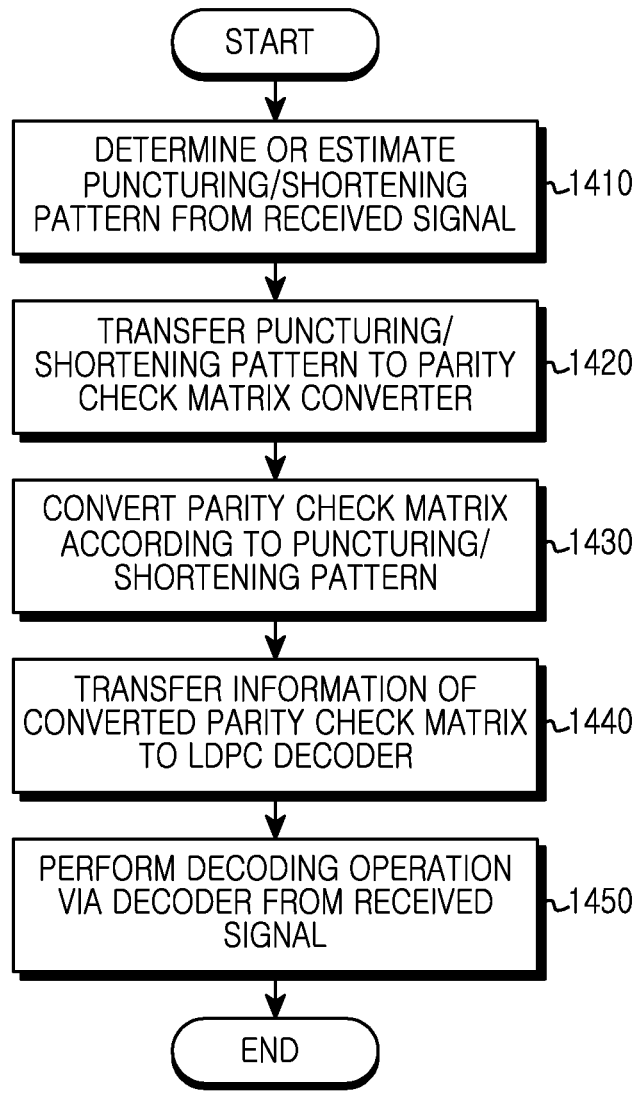
FIG. 14 is a flowchart illustrating an operation process of a receiver according to an embodiment of the present invention.

FIG. 14 is a flowchart illustrating an operation process of a receiver according to an embodiment of the present invention.

Referring to FIG. 14, the receiver described therein is a receiver as illustrated in FIG. 12, where the parity check matrix converter 1260 is directly applied to the system to allow the LDPC decoder 1240 of the system to use a converted parity check matrix obtained by applying <weight-1 position sequence conversion process> to an initially given parity check matrix.

When puncturing or shortening is applied to a given broadcasting/communication system, the shortening, puncturing pattern determining or estimating units 1120 determines or estimates a puncturing and shortening pattern from a received signal in step 1410.

The determined or estimated puncturing and shortening pattern is transferred to the parity check matrix converter 1260 via the controller 1230 and the parity check matrix extractor 1250 in step 1420.

The parity check matrix converter 1260 applies <weight-1 position sequence conversion process> to an initially given parity check matrix in step 1430, and transfers information regarding a converted parity check matrix to the LDPC decoder 1240 in step 1440. The LDPC decoder 1240 decodes a received signal in step 1450.

When puncturing or shortening is not applied in a given broadcasting/communication system, operations from step 1410 to step 1440 may be changed or omitted.

The above-described embodiments of the present invention provide a method and an apparatus for encoding/decoding a channel in a broadcasting/communication system that uses an LDPC code.

More particularly, these embodiments provide a channel encoding/decoding apparatus and a method thereof, which reduce channel encoding/decoding complexity when applying puncturing and shortening.

In addition, a method and an apparatus are provided for performing encoding/decoding via a converted parity check matrix.

Further, a channel encoding/decoding method and an apparatus thereof are provided, which use a linear code based on a parity check matrix in a broadcasting/communication and broadcasting system.

Further, a method and an apparatus are provided for raising efficiency of a transceiver when applying shortening or puncturing to a code.

More particularly, a method for converting a given parity check matrix is provided in order to perform efficient encoding/decoding when applying shortening or puncturing in a broadcasting/communication and broadcasting system that uses an LDPC code.

Basically, the above-described embodiments of the present invention change a parity check matrix of a given parity check code or LDPC code to reduce encoding/decoding complexity, and increase a decoding convergence speed to obtain performance improvement in a broadcasting/communication system that applies puncturing when performing encoding/decoding using a parity check code or an LDPC code.

Although the present invention has been shown and described with reference to certain embodiments thereof, it will be understood by those skilled in the art that various changes in form and details may be made therein without departing from the spirit and scope of the invention as defined by the appended claims and their equivalents.

What is claimed is:

1. An encoding method of a transmission terminal in a broadcasting/communication system using a Low Density Parity Check (LDPC) code, the method comprising:
    performing a weight-1 position sequence conversion procedure on an initial parity check matrix;
    shortening an information word;
    generating a codeword by LDPC encoding the shortened information word using a parity check matrix generated by performing the weight-1 position sequence conversion procedure; and
    puncturing the codeword,
    wherein performing the weight-1 position sequence conversion procedure on the initial parity check matrix comprises:
    generating a weight-1 position sequence from the initial parity check matrix;
    applying a puncturing rule to a parity check matrix corresponding to the weight-1 position sequence;
    generating a first weight-1 position sequence using a weight-1 position sequence conversion;
    applying the puncturing rule to a parity check matrix corresponding to the first weight-1 position sequence; and
    generating a second weight-1 position sequence using the weight-1 position sequence conversion.

2. The method of claim 1, wherein the puncturing rule determines A parity bits to be punctured among a 0-th parity bit to a $(q_1-1)$-th parity bit $P_0, P_1, \ldots, P_{q_1-1}$, and all parity bits corresponding to $P_{x_i+q_1 \cdot j}$ are punctured with respect to $i=0, 1, \ldots, (A-1)$, $j=0, 1, \ldots, (M_1-1)$,
    wherein all of the parity bits are denoted by $P_0, P_1, \ldots, P_{N_1-K_1-1}$ in a sequence and the A parity bits to be punctured are denoted by $P_{x_0}, P_{x_1}, \ldots, P_{x_{(A-1)}}$, and
    wherein $N_1$ and $K_1$ denote a codeword length and an information word length of a parity check code, respectively, $M_1$ denotes a number of grouped columns for a partial matrix corresponding to the information word, and $q_1$ is an integer satisfying $q_1=(N_1-K_1)/M_1$.

3. The method of claim 1, wherein applying the puncturing rule to the parity check matrix corresponding to the first weight-1 position sequence, and generating the second weight-1 position sequence using the weight-1 position sequence conversion comprise:
    (a) not changing a number that is greater than or equal to 0, and less than or equal to $x_0$ in the first weight-1 position sequence;
    (b) applying $-j$ to all numbers that are greater than $x_0+q_1 \cdot (j-1)$ and less than or equal to $x_0+q_1 \cdot j$, with respect to $j=1, 2, \ldots, (M_1-1)$;
    (c) applying $-M_1$ to a number that is greater than $x_0+q_1 \cdot (M_1-1)$;
    (d) replacing the first weight-1 position sequence by a weight-1 position sequence newly obtained during the first, second, and third processes;
    (e) replacing like $q_1 \leftarrow (q_1-1)$;
    (f) a sixth process of replacing $A \leftarrow (A-1)$;
    (g) when $A<1$, storing a finally obtained weight-1 position sequence as a second weight-1 sequence;
    (h) when $A \geq 1$, sequentially applying $x_{i-1} \leftarrow (x_i-1)$ with respect to $i=1, \ldots, A$, and the eighth process is repeating steps (a)-(i); and
    (i) storing a final $q_1$ value as $q_{effective}$,
    wherein A denotes the number of parity bits to be punctured, $N_1$ and $K_1$ denote a codeword length and an information word length of a parity check code, respectively, $M_1$ denotes a number of grouped columns for a partial matrix corresponding to the information word, and $q_1$ is an integer satisfying $q_1=(N_1-K_1)/M_1$.

4. The method of claim 1, wherein the first weight-1 position sequence is configured as:

| |
|---|
| 875 1337 43 1069 672 686 231 20 1557 773 882 1744 |
| 1485 693 537 519 427 486 1068 1433 829 1121 1153 1541 |
| 1497 502 724 1553 1067 493 1215 915 1006 1704 372 597 |
| 1649 515 831 1211 682 1479 945 463 365 1453 1290 1545 |
| 1090 428 1497 |
| 470 1508 798 |
| 189 1668 1695 |
| 860 589 326 |
| 1367 1768 692. |

5. The method of claim 1, wherein the second weight-1 position sequence is configured as:

| |
|---|
| 875 1337 43 1069 672 686 231 20 1557 773 882 1744 |
| 1367 1768 692. |

6. A decoding method of a reception terminal in a broadcasting/communication system using a Low Density Parity Check (LDPC) code, the method comprising:
 determining or estimating a puncturing and shortening pattern from a received signal, when puncturing or shortening has been applied;
 performing a weight-1 position sequence conversion procedure on an initial parity check matrix based on the determined or estimated puncturing or shortening pattern; and
 performing an LDPC decoding on the received signal using information regarding the converted parity check matrix,
 wherein performing the weight-1 position sequence conversion procedure on the initial parity check matrix comprises:
 generating a weight-1 position sequence from the initial parity check matrix;
 applying a puncturing rule to a parity check matrix corresponding to the weight-1 position sequence;
 generating a first weight-1 position sequence using weight-1 position sequence conversion;
 applying the puncturing rule to a parity check matrix corresponding to the first weight-1 position sequence; and
 generating a second weight-1 position sequence using the weight-1 position sequence conversion.

7. The method of claim 6, wherein the puncturing rule determines A parity bits to be punctured among a 0-th parity bit to a $(q_1-1)$-th parity bit $P_0, P_1, \ldots, P_{q_1-1}$, and all parity bits corresponding to $P_{x_i+q_1 \cdot j}$ are punctured with respect to $i=0, 1, \ldots, (A-1), j=0, 1, \ldots, (M_1-1)$,
 wherein all of the parity bits are denoted by $P_0, P_1, \ldots, P_{N_1-K_1-1}$ in a sequence and the A parity bits to be punctured are denoted by $P_{x_0}, P_{x_1}, \ldots, P_{x_{(A-1)}}$, and
 wherein $N_1$ and $K_1$ denote a codeword length and an information word length of a parity check code, respectively, $M_1$ denotes a number of grouped columns for a partial matrix corresponding to the information word, and $q_1$ is an integer satisfying $q_1=(N_1-K_1)/M_1$.

8. The method of claim 6, wherein applying the puncturing rule to the parity check matrix corresponding to the first weight-1 position sequence, and generating the second weight-1 position sequence using the weight-1 position sequence conversion comprise:
 (a) not changing a number that is greater than or equal to 0, and less than or equal to $x_0$ in the first weight-1 position sequence;
 (b) applying $-j$ to all numbers that are greater than $x_0+q_1 \cdot (j-1)$ and less than or equal to $x_0+q_1 \cdot j$, with respect to $j=1, 2, \ldots, (M_1-1)$;
 (c) applying $-M_1$ to a number that is greater than $x_0+q_1 \cdot (M_1-1)$;
 (d) replacing the first weight-1 position sequence by a weight-1 position sequence newly obtained during the first, second, and third processes;
 (e) replacing like $q_1 \leftarrow (q_1-1)$;
 (f) replacing $A \leftarrow (A-1)$;
 (g) when $A<1$, storing a finally obtained weight-1 position sequence as a second weight-1 sequence;
 (h) when $A \geq 1$, sequentially applying $x_{i-1} \leftarrow (x_i-1)$ with respect to $i=1, \ldots, A$, and the eighth process is repeating steps (a)-(i); and
 (i) storing a final $q_1$ value as $q_{\textit{effective}}$,
 wherein A denotes the number of parity bits to be punctured, $N_1$ and $K_1$ denote a codeword length and an information word length of a parity check code, respectively, $M_1$ denotes a number of grouped columns for a partial matrix corresponding to the information word, and $q_1$ is an integer satisfying $q_1=(N_1-K_1)/M_1$.

9. The method of claim 6, wherein the first weight-1 position sequence is configured as:

| |
|---|
| 875 1337 43 1069 672 686 231 20 1557 773 882 1744 |
| 1485 693 537 519 427 486 1068 1433 829 1121 1153 1541 |
| 1497 502 724 1553 1067 493 1215 915 1006 1704 372 597 |
| 1649 515 831 1211 682 1479 945 463 365 1453 1290 1545 |
| 1090 428 1497 |
| 470 1508 798 |
| 189 1668 1695 |
| 860 589 326 |
| 1367 1768 692. |

10. The method of claim 6, wherein the second weight-1 position sequence is configured as:

| |
|---|
| 875 1337 43 1069 672 686 231 20 1557 773 882 1744 |
| 1367 1768 692. |

11. An apparatus of a transmission terminal, for performing encoding using a Low Density Parity Check (LDPC) code, the apparatus comprising:
 a parity check matrix extractor for performing a weight-1 position sequence conversion procedure on an initial parity check matrix;
 a shortening unit for shortening an information word;
 a parity check matrix conversion unit for generating a parity check matrix by performing the weight-1 position sequence conversion procedure;
 an LDPC encoder for generating a codeword by LDPC encoding the information word using the parity check matrix; and
 a puncturing unit for puncturing the codeword,
 wherein the parity check matrix extractor generates a weight-1 position sequence from the initial parity check matrix when performing the weight-1 position sequence conversion procedure on the initial parity check matrix, applies a puncturing rule to a parity check matrix corresponding to the weight-1 position sequence, generates a first weight-1 position sequence using a weight-1 position sequence conversion, applies the puncturing rule to a parity check matrix corresponding to the first weight-1 position sequence, and generates a second weight-1 position sequence using the weight-1 position sequence conversion.

12. The apparatus of claim 11, wherein the puncturing rule determines A parity bits to be punctured among a 0-th parity bit to a $(q_1-1)$-th parity bit $P_0, P_1, \ldots, P_{q_1-1}$, and all parity bits corresponding to $P_{x_i+q_1 \cdot j}$ are punctured with respect to i=0, 1, ..., (A−1), j=0, 1, ..., ($M_1$−1), wherein all of the parity bits are denoted by $P_0, P_1, \ldots, P_{N_1-K_1-1}$ in a sequence and the A parity bits to be punctured are denoted by $P_{x_0}, P_{x_1}, \ldots, P_{x_{(A-1)}}$, and wherein $N_1$ and $K_1$ denote a codeword length and an information word length of a parity check code, respectively, $M_1$ denotes a number of grouped columns for a partial matrix corresponding to the information word, and $q_1$ is an integer satisfying $q_1 = (N_1-K_1)/M_1$.

13. The apparatus of claim 11, wherein when applying the puncturing rule to the parity check matrix corresponding to the first weight-1 position sequence, and generating the second weight-1 position sequence using the weight-1 position sequence conversion, the parity check matrix extractor performs:

(a) not changing a number that is greater than or equal to 0, and less than or equal to $x_0$ in the first weight-1 position sequence;

(b) applying −j to all numbers that are greater than $x_0+q_1 \cdot (j-1)$ and less than or equal to $x_0+q_1 \cdot j$, with respect to j=1, 2, ..., ($M_1$−1);

(c) applying $-M_1$ to a number that is greater than $x_0+q_1 \cdot (M_1-1)$;

(d) replacing the first weight-1 position sequence by a weight-1 position sequence newly obtained during the first, second, and third processes;

(e) replacing like $q_1 \leftarrow (q_1-1)$;

(f) replacing A←(A−1);

(g) when A<1, storing a finally obtained weight-1 position sequence as a second weight-1 sequence;

(h) when A≥1, sequentially applying $x_{i-1} \leftarrow (x_i-1)$ with respect to i=1, ..., A, and the eighth process is repeating steps (a)-(i); and (i) storing a final $q_1$ value as $q_{effective}$, wherein A denotes the number of parity bits to be punctured, $N_1$ and $K_1$ denote a codeword length and an information word length of a parity check code, respectively, $M_1$ denotes a number of grouped columns for a partial matrix corresponding to the information word, and $q_1$ is an integer satisfying $q_1 = (N_1-K_1)/M_1$.

14. The apparatus of claim 11, wherein the first weight-1 position sequence is configured as:

875 1337 43 1069 672 686 231 20 1557 773 882 1744
1485 693 537 519 427 486 1068 1433 829 1121 1153 1541
1497 502 724 1553 1067 493 1215 915 1006 1704 372 597
1649 515 831 1211 682 1479 945 463 365 1453 1290 1545
1090 428 1497
470 1508 798
189 1668 1695
860 589 326
1367 1768 692.

15. The apparatus of claim 11, wherein the second weight-1 position sequence is configured as:

875 1337 43 1069 672 686 231 20 1557 773 882 1744
1367 1768 692.

16. An apparatus of a reception terminal, for performing decoding using a Low Density Parity Check (LDPC) code, the apparatus comprising:

a shortening, puncturing pattern determining or estimating unit for determining or estimating a puncturing and shortening pattern from a received signal, when puncturing or shortening has been applied;

a parity check matrix extractor for performing a weight-1 position sequence conversion procedure on an initial parity check matrix based on the determined or estimated puncturing and shortening pattern; and an LDPC decoder for LDPC decoding the received signal using information regarding the converted parity check matrix, wherein the parity check matrix extractor generates a weight-1 position sequence from the initial parity check matrix when performing the weight-1 position sequence conversion procedure on the initial parity check matrix, applies a puncturing rule to a parity check matrix corresponding to the weight-1 position sequence, generates a first weight-1 position sequence using a weight-1 position sequence conversion, applies the puncturing rule to a parity check matrix corresponding to the first weight-1 position sequence, and generates a second weight-1 position sequence using the weight-1 position sequence conversion.

17. The apparatus of claim 16, wherein the puncturing rule determines A parity bits to be punctured among a 0-th parity bit to a $(q_1-1)$-th parity bit $P_0, P_1, \ldots, P_{q_1-1}$, and all parity bits corresponding to $P_{x_i+q_1 \cdot j}$ are punctured with respect to i=0, 1, ..., (A−1), j=0, 1, ..., ($M_1$−1), wherein all of the parity bits are denoted by $P_0, P_1, \ldots, P_{N_1-K_1-1}$, in a sequence and the A parity bits to be punctured are denoted by $P_{x_0}, P_{x_1}, \ldots, P_{x_{(A-1)}}$, and wherein $N_1$ and $K_1$ denote a codeword length and an information word length of a parity check code, respectively, $M_1$ denotes a number of grouped columns for a partial matrix corresponding to the information word, and $q_1$ is an integer satisfying $q_1 = (N_1-K_1)/M_1$.

18. The apparatus of claim 16, wherein when applying the puncturing rule to the parity check matrix corresponding to the first weight-1 position sequence and generating the second weight-1 position sequence using the weight-1 position sequence conversion, the parity check matrix extractor performs:

(a) not changing a number that is greater than or equal to 0, and less than or equal to $x_0$ in the first weight-1 position sequence;

(b) applying −j to all numbers that are greater than $x_0+q_1 \cdot (j-1)$ and less than or equal to $x_0+q_1 \cdot j$, with respect to j=1, 2, ..., ($M_1$−1);

(c) applying $-M_1$ to a number that is greater than $x_0+q_1 \cdot (M_1-1)$;

(d) replacing the first weight-1 position sequence by a weight-1 position sequence newly obtained during the first, second, and third processes;

(e) replacing like $q_1 \leftarrow (q_1-1)$;

(f) replacing A←(A−1);

(g) when A<1, storing a finally obtained weight-1 position sequence as a second weight-1 sequence;

(h) when A≥1, sequentially applying $x_{i-1} \leftarrow (x_i-1)$ with respect to i=1, ..., A, and the eighth process is repeating steps (a)-(i); and (i) storing a final $q_1$ value as $q_{\textit{effective}}$, wherein A denotes the number of parity bits to be punctured, $N_1$ and $K_1$ denote a codeword length and an information word length of a parity check code, respectively, $M_1$ denotes a number of grouped columns for a partial matrix corresponding to the information word, and $q_1$ is an integer satisfying $q_1=(N_1-K_1)M_1$.

19. The apparatus of claim 16, wherein the first weight-1 position sequence is configured as:

```
875 1337 43 1069 672 686 231 20 1557 773 882 1744
1485 693 537 519 427 486 1068 1433 829 1121 1153 1541
1497 502 724 1553 1067 493 1215 915 1006 1704 372 597
1649 515 831 1211 682 1479 945 463 365 1453 1290 1545
1090 428 1497
470 1508 798
189 1668 1695
860 589 326
1367 1768 692.
```

20. The apparatus of claim 16, wherein the second weight-1 position sequence is configured as:

```
875 1337 43 1069 672 686 231 20 1557 773 882 1744
1367 1768 692.
```

* * * * *